(12) United States Patent
Shimomura et al.

(10) Patent No.: US 7,816,232 B2
(45) Date of Patent: Oct. 19, 2010

(54) METHOD FOR MANUFACTURING SEMICONDUCTOR SUBSTRATE AND SEMICONDUCTOR SUBSTRATE MANUFACTURING APPARATUS

(75) Inventors: Akihisa Shimomura, Kanagawa (JP); Masaki Koyama, Kanagawa (JP); Satohiro Okamoto, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 33 days.

(21) Appl. No.: 12/275,809

(22) Filed: Nov. 21, 2008

(65) Prior Publication Data

US 2009/0137095 A1 May 28, 2009

(30) Foreign Application Priority Data

Nov. 27, 2007 (JP) ............... 2007-305461

(51) Int. Cl.
*H01L 21/30* (2006.01)

(52) U.S. Cl. ..................................... 438/455

(58) Field of Classification Search ............... 438/455; 156/382
See application file for complete search history.

(56) References Cited

U.S. PATENT DOCUMENTS

| 5,546,208 | A | 8/1996 | Shimizu et al. |
| 6,534,380 | B1 | 3/2003 | Yamauchi et al. |
| 6,844,910 | B2 | 1/2005 | Katsura |
| 2002/0048907 | A1* | 4/2002 | Miyamoto et al. ......... 438/464 |
| 2004/0145692 | A1 | 7/2004 | Yamazaki et al. |
| 2005/0077066 | A1* | 4/2005 | Stipes .......................... 174/27 |
| 2006/0148129 | A1* | 7/2006 | Lim et al. ................... 438/106 |
| 2006/0160327 | A1* | 7/2006 | Barna ......................... 438/455 |
| 2008/0224274 | A1 | 9/2008 | Yamazaki et al. |
| 2008/0242050 | A1 | 10/2008 | Yamazaki et al. |
| 2008/0246109 | A1 | 10/2008 | Ohnuma et al. |
| 2008/0248629 | A1 | 10/2008 | Yamazaki |
| 2008/0268618 | A1 | 10/2008 | Yamazaki |

FOREIGN PATENT DOCUMENTS

JP  11-097379  4/1999

* cited by examiner

*Primary Examiner*—Bradley K Smith
(74) *Attorney, Agent, or Firm*—Fish & Richardson P.C.

(57) ABSTRACT

An object is to provide a uniform semiconductor substrate in which defective bonding is reduced. A further object is to manufacture the semiconductor substrate with a high yield. A first substrate and a second substrate are bonded in a reduced-pressure atmosphere by placing the first substrate at a certain region surrounded by an airtight holding mechanism provided over a support to surround the certain region of a surface of the support; placing the second substrate so as to come to be in contact with the airtight holding mechanism to ensure airtightness of a space surrounded by the support, the airtight holding mechanism, and the second substrate; evacuating the space whose airtightness is secured, thereby reducing a pressure in the space; disposing the second substrate in close contact with the first substrate using difference between the pressure in the space and outside atmospheric pressure; and performing heat treatment.

8 Claims, 20 Drawing Sheets

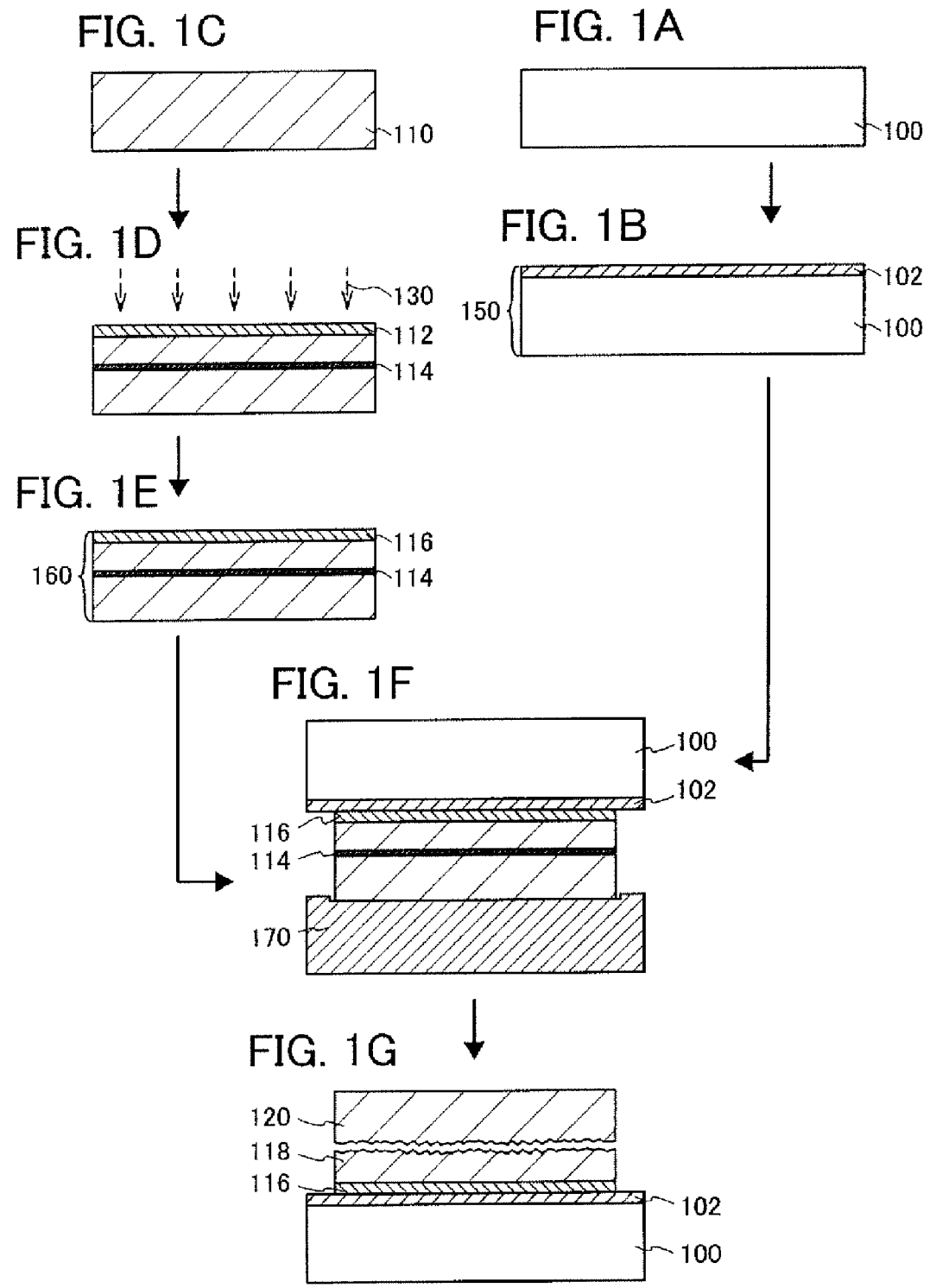

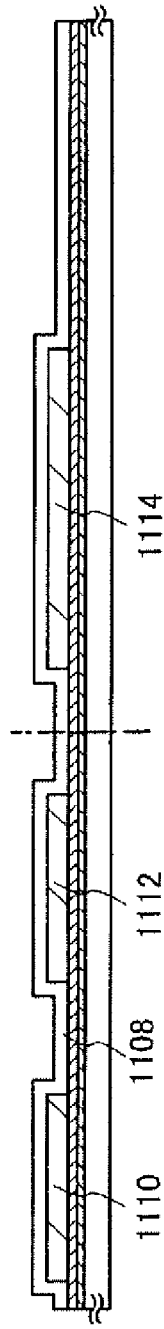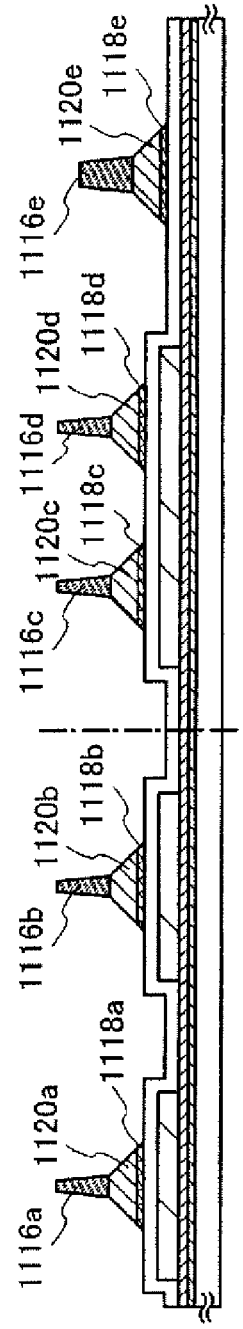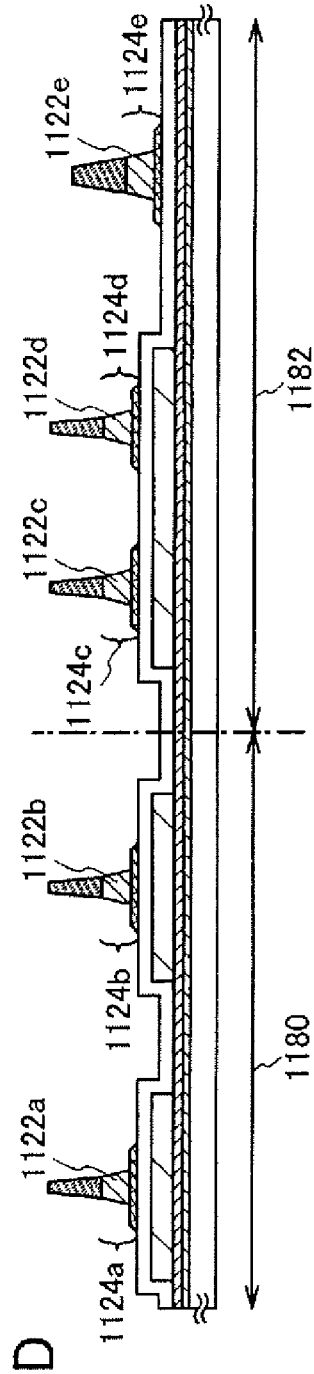

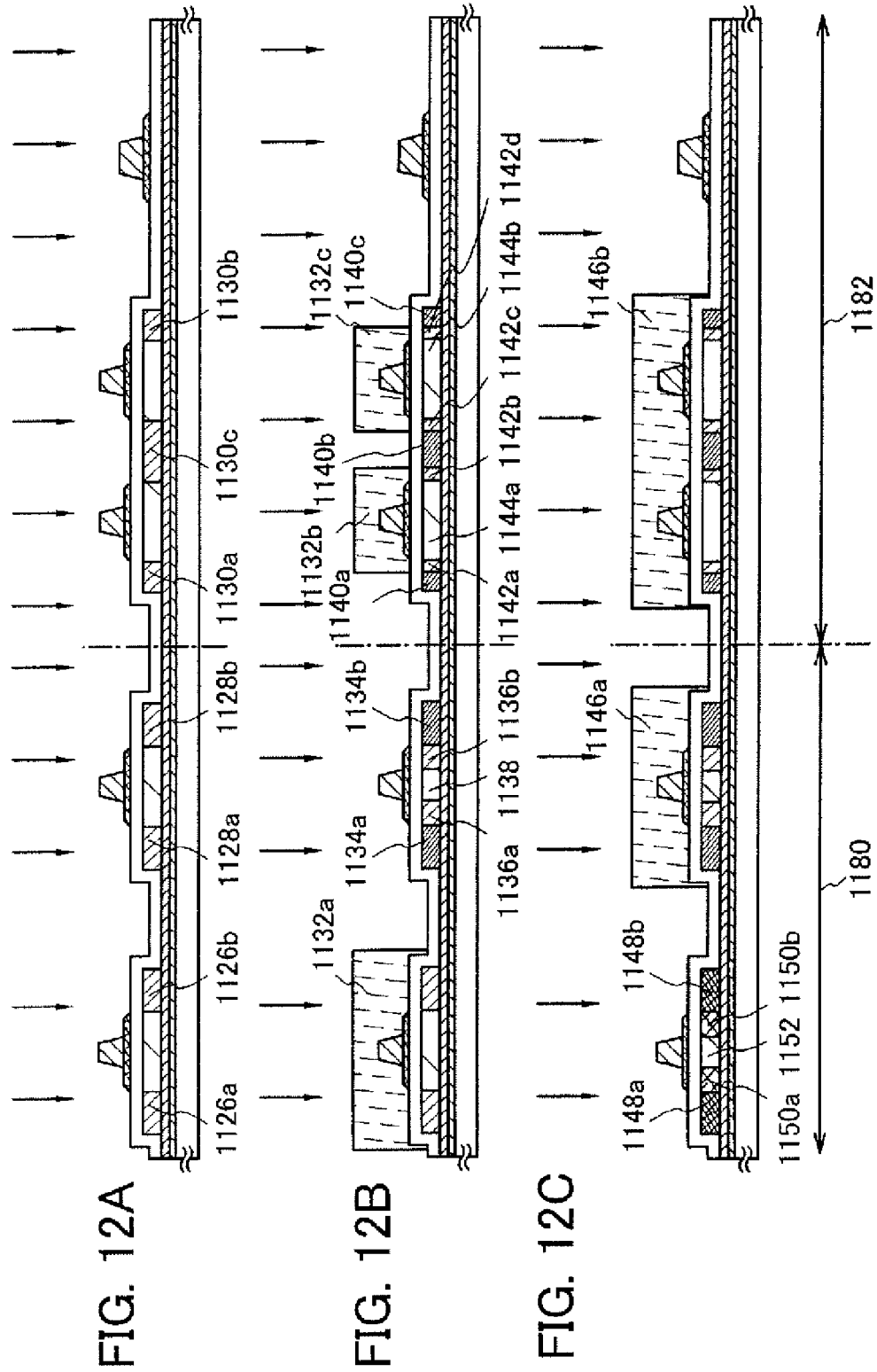

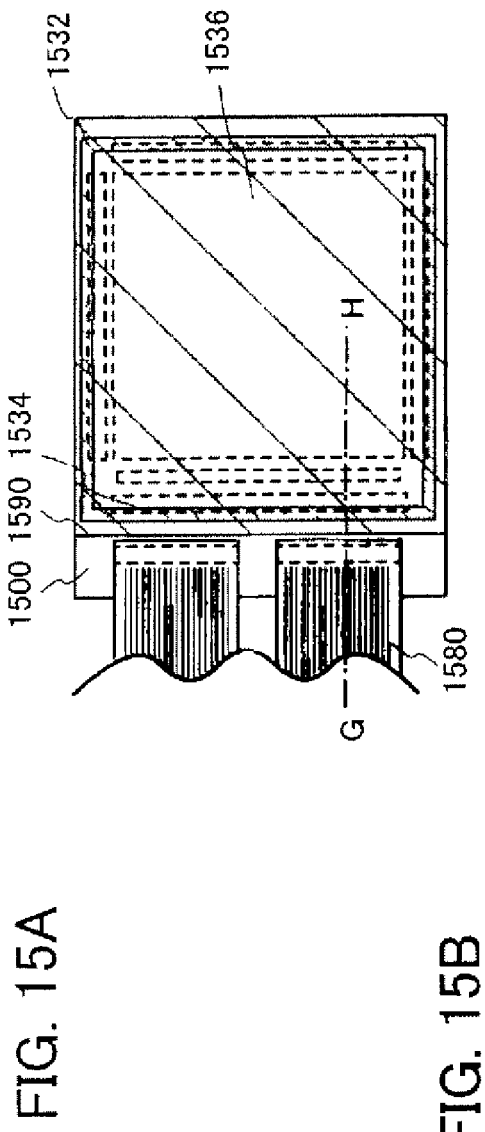
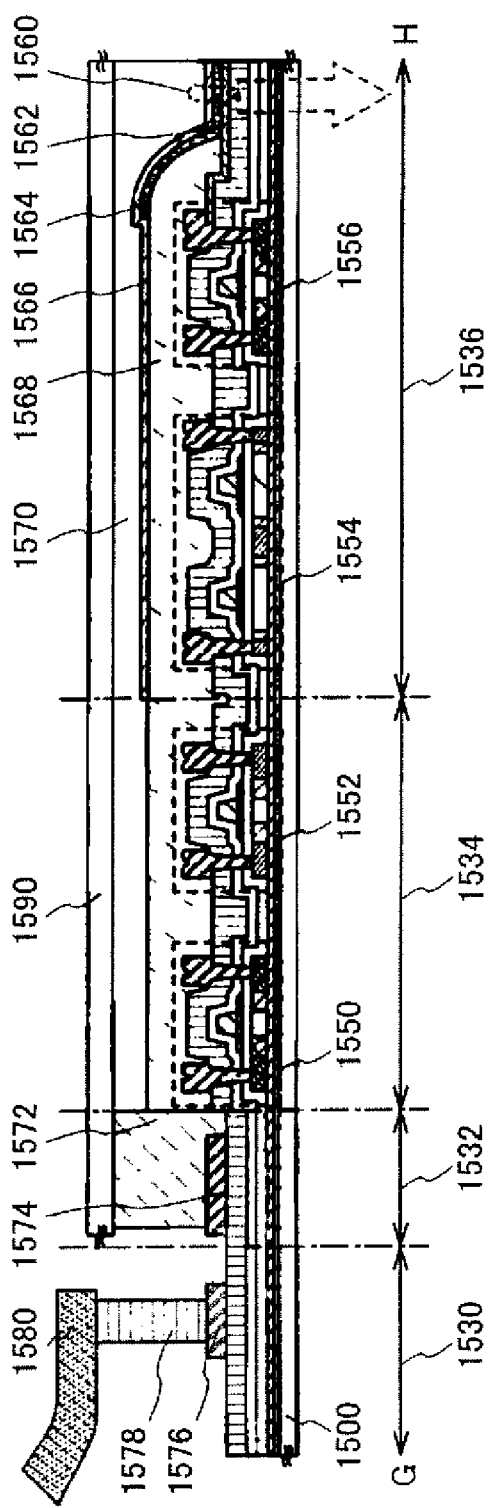
FIG. 15A
FIG. 15B

METHOD FOR MANUFACTURING SEMICONDUCTOR SUBSTRATE AND SEMICONDUCTOR SUBSTRATE MANUFACTURING APPARATUS

BACKGROUND OF THE INVENTION

1. Field of the Invention

The present invention relates to a method for manufacturing a semiconductor substrate and a semiconductor substrate manufacturing apparatus.

2. Description of the Related Art

In recent years, instead of a bulk silicon wafer, integrated circuits using an SOI (silicon on insulator) substrate have been developed. By utilizing characteristics of a thin single crystal silicon layer formed over an insulating layer, transistors formed in the integrated circuit can be electrically separated from each other completely. Further, each transistor can be formed as a fully-depleted transistor, and thus a semiconductor integrated circuit with high added value such as high integration, high speed driving, and low power consumption can be realized.

As a method for manufacturing an SOI substrate, a hydrogen-ion-implantation separation method in which hydrogen ion implantation and separation are combined is known. A typical process of a hydrogen-ion-implantation separation method is described below.

First, hydrogen ions are implanted into a silicon wafer to form an ion implantation layer at a predetermined depth from the surface. Next, a silicon oxide film is formed by oxidizing another silicon wafer which serves as a base substrate. After that, the silicon wafer into which hydrogen ions are implanted is attached firmly to the silicon oxide film of the another silicon wafer, so that the two silicon wafers are bonded to each other. Then, heat treatment is performed so that the wafer is cleaved with the ion implantation layer used as a cleaved surface.

There is a known method in which a single crystal silicon layer is formed over a glass substrate by a hydrogen-ion-implantation separation method (e.g., Reference 1: Japanese Published Patent Application No. H11-097379). In Reference 1, a separation plane is mechanically polished in order to remove a defect layer formed by ion implantation or difference in level which is several to several tens of nanometers in height in the separation plane.

SUMMARY OF THE INVENTION

One of the problems in manufacturing a new semiconductor substrate by bonding substrates as described above is defective bonding. Bonding is performed by disposing substrates in close contact with each other and applying pressure thereto; however, a state of bonding widely varies according to a condition of surfaces to be bonded (hereinafter referred to as bonding surfaces). For example, when there exists dust on the surfaces, a probability of generating voids is high due to defective bonding in a region where the dust exists. Further, when also air remains on the surfaces, a similar defect is generated.

Characteristics of a semiconductor layer in the vicinity of the region deteriorate due to the voids generated by the above defects. That is, when a semiconductor device is manufactured using a semiconductor substrate in which such a defect is generated, the performance of the semiconductor device is degraded by variation in characteristics of semiconductor elements. Thus, it can be said that the influence caused by defective bonding is remarkably high.

Further, because bonding is performed by applying pressure, a state of bonding probably varies according to the way the pressure is applied. For example, when substrates are bonded by locally applying pressure, defective bonding may be caused by distortion of the substrates or the like. Furthermore, characteristics of a semiconductor element may vary locally by the distortion of the substrates due to applied pressure, and thus the performance of the semiconductor device may be degraded.

In view of the above problems, it is an object of the present invention to provide a uniform semiconductor substrate in which defective bonding is reduced. It is a further object of the present invention to manufacture the semiconductor substrate with a high yield. It is a still further object of the present invention to provide a semiconductor substrate manufacturing apparatus which is suitable for a manufacturing method.

In the present invention, in order to solve the aforementioned problems, substrates are bonded to each other in a reduced-pressure atmosphere (including a vacuum). In addition, bonding is performed by disposing substrates in close contact with each other using atmospheric pressure. A specific manufacturing method and a manufacturing apparatus are as follows.

One aspect of a method for manufacturing a semiconductor substrate of the present invention is a method for manufacturing a semiconductor substrate in which two substrates are bonded, which includes the steps of: placing a first substrate at a certain region surrounded by an airtight holding mechanism provided over a support to surround the certain region of a surface of the support; placing a second substrate so as to be in contact with the airtight holding mechanism to ensure airtightness of a space surrounded by the support, the airtight holding mechanism, and the second substrate; evacuating the space whose airtightness is secured, thereby reducing pressure in the space; disposing the second substrate in close contact with the first substrate using difference between an pressure in the space and outside atmpspheric pressure; and performing heat treatment, thereby bonding the first substrate and the second substrate in a reduced-pressure atmosphere.

In the above steps, an elastic body can be used in part of the airtight holding mechanism. As the elastic body, for example, silicone rubber, fluorine-based rubber, perfluoro-rubber, or the like can be used. In addition, the airtight holding mechanism may have a function of adjusting the interval between the first substrate and the second substrate. Furthermore, the support may be provided with a mechanism having a function of adjusting the interval between the first substrate and the second substrate.

One aspect of a semiconductor substrate manufacturing apparatus of the present invention is to include a support; an airtight holding mechanism provided so as to surround a certain region of a surface of the support; a vacuum pump connected to the certain region; and a heating means.

Another aspect of a semiconductor substrate manufacturing apparatus of the present invention is a semiconductor substrate manufacturing apparatus in which two substrates are bonded and which includes: a support for placing a first substrate; an airtight holding mechanism for supporting the second substrate, which is provided so as to surround a region for placing the first substrate over the surface of the support; a vacuum pump for evacuating the space surrounded by the support, the airtight holding mechanism, and the second substrate; and a means for heating the first substrate and the second substrate.

In the above semiconductor substrate manufacturing apparatus, the airtight holding mechanism may have an elastic body in a part. As the elastic body, for example, silicone rubber, fluorine-based rubber, perfluoro-rubber, or the like can be used. In addition, the airtight holding mechanism may have a function of adjusting its own height.

As described, in the present invention, substrates are bonded in a reduced-pressure atmosphere (including a vacuum). Accordingly, adhesion of dust or the like in air to bonding surfaces can be reduced, and the air can be prevented from remaining on the surfaces to be bonded. That is, generation of voids can be suppressed. Further, in the present invention, bonding is performed by disposing the substrates in close contact with each other using difference in pressure. Accordingly, pressure to be applied to the substrates can be uniform, whereby bonding can be preferably performed. Furthermore, by using the difference in pressure, enough pressure for bonding can be applied. In addition, in the present invention, the air of a minimum space needed for the bonding is evacuated (depressurized); therefore, it is not necessary to prepare a vacuum chamber or the like separately, and miniaturization of a apparatus is easily achieved. Furthermore, since only the minimum space is evacuated, efficiency in evacuation is improved. That is, a semiconductor substrate can be manufactured efficiently.

BRIEF DESCRIPTION OF THE DRAWINGS

FIGS. 1A to 1G illustrate a method for manufacturing a semiconductor substrate;
FIGS. 11A to 11D illustrate manufacturing steps of a semiconductor device;
FIGS. 12A to 12C illustrate manufacturing steps of the semiconductor device;
FIGS. 15A and 15B are a plan view and a cross-sectional view of a semiconductor device.

DETAILED DESCRIPTION OF THE INVENTION

Embodiment Mode

Figure 2A:
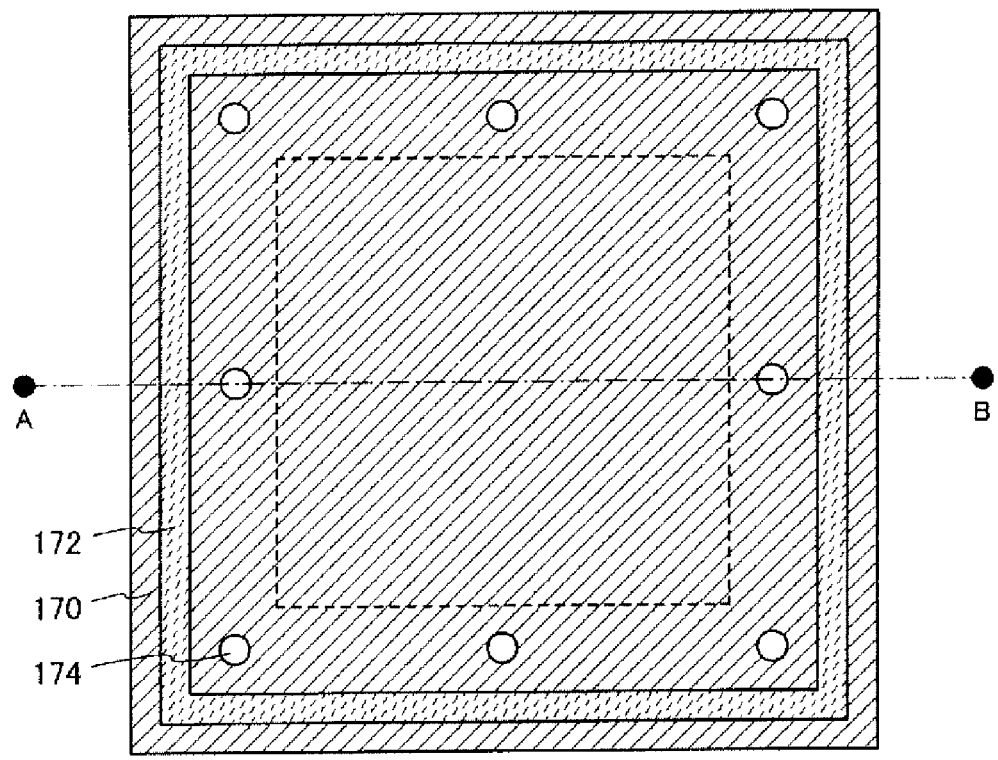
FIGS. 2A and 2B illustrate a manufacturing apparatus of a semiconductor substrate.

Hereinafter, embodiment modes of the present invention will be described with reference to the accompanying drawings. Note that the present invention is not limited to the description below, and it is easily understood by those skilled in the art that modes and details can be modified in various ways without departing from the purpose and the scope of the present invention. Therefore, the present invention should not be interpreted as being limited to the descriptions of embodiment modes below. In the following structure, the reference numeral indicating the same part will be used in common throughout the drawings. In this specification, the semiconductor device indicates all the devices that operate by utilizing semiconductor characteristics.

Embodiment Mode 1

This embodiment mode describes examples of methods for manufacturing semiconductor substrates of the present invention with reference to FIGS. 1A to 1G, FIGS. 2A and 2B, FIGS. 3A to 3D, and FIGS. 4A to 4C.

First, a base substrate 100 is prepared (see FIG. 1A). As the base substrate 100, a light-transmitting glass substrate which can be used for a liquid crystal display device or the like can be used. It is preferable to use, as the glass substrate, a substrate having a strain point which is greater than or equal to 580° C. and less than or equal to 680° C. (preferably, greater than or equal to 600° C. and less than or equal to 680° C.); however, it is not limited hereto. Further, it is preferable that the glass substrate be a non-alkali glass substrate. As a material of the non-alkali glass substrate, a glass material such as aluminosilicate glass, aluminoborosilicate glass, or barium borosilicate glass is used, for example.

Note that, as the base substrate 100, as well as the glass substrate, an insulating substrate which is formed of an insulating material, such as a ceramic substrate, a quartz substrate, or a sapphire substrate; a semiconductor substrate which is formed of a semiconductor material such as silicon; a conductive substrate which is formed of a conductive material such as metal or stainless steel; or the like can be used.

Next, an insulating layer 102 is formed on a surface of the base substrate 100 (see FIG. 1B). The insulating layer 102 can be a single-layer structure or a stacked-layer structure. As a material for forming the insulating layer 102, an insulating material containing silicon or germanium as its component such as silicon oxide, silicon nitride, silicon oxynitride, silicon nitride oxide, germanium oxide, germanium nitride, germanium oxynitride, or germanium nitride oxide can be used. Further, a metal oxide such as aluminum oxide, tantalum oxide, or hafnium oxide; a metal nitride such as aluminum nitride; a metal oxynitride such as aluminum oxynitride; or a metal nitride oxide such as aluminum nitride oxide can be used as well.

Note that, in this specification, an oxynitride is a substance that contains more oxygen than nitrogen. For example, silicon oxynitride contains, for example, oxygen, nitrogen, silicon, and hydrogen at concentrations ranging from 50 at. % to 70 at. % inclusive, from 0.5 at. % to 15 at. % inclusive, from 25 at. % to 35 at. % inclusive, and from 0.1 at. % to 10 at. % inclusive, respectively. Further, nitride oxide contains more nitrogen than oxygen and includes, for example, oxygen, nitrogen, silicon, and hydrogen at concentrations ranging from 5 at. % to 30 at. % inclusive, from 20 at. % to 55 at. % inclusive, from 25 at. % to 35 at. % inclusive, and from 10 at. % to 25 at. % inclusive, respectively. Note that the above-described ranges are ranges for the cases measured using Rutherford backscattering spectrometry (RBS) or hydrogen forward scattering (HFS). Moreover, the total for the content ratio of the constituent elements does not exceed 100 at. %.

Although a structure without forming the insulating layer 102 may be employed, in the case where a substrate including an impurity which reduces reliability of a semiconductor device, such as an alkali metal or an alkaline earth metal, is used as the base substrate 100, it is preferable to provide the insulating layer 102 so that such an impurity does not diffuse from the base substrate 100 into a semiconductor layer. For such an application, silicon nitride, silicon nitride oxide, aluminum nitride, aluminum nitride oxide, or the like is suitable.

Note that a structure illustrated in FIG. 1B is hereinafter referred to as a substrate 150 for convenience.

Then, a single crystal semiconductor substrate 110 is prepared (FIG. 1C). As the single crystal semiconductor substrate 110, for example, a semiconductor substrate formed of a Group 4 element such as silicon, germanium, silicon germanium, or silicon carbide can be used. It is needless to say that a semiconductor substrate made of a compound semiconductor such as gallium arsenide or indium phosphide may be used as well. In this embodiment mode, a single crystal silicon substrate is used as the single crystal semiconductor substrate 110. There is not a limit on the size of the single crystal semiconductor substrate 110; for example, it is preferable that a circular semiconductor substrate having a diameter of 8 inches (200 mm), 12 inches (300 mm), 18 inches (450 mm), or the like be processed into a rectangular shape to be used. Note that in this specification, a "single crystal" has certain regularity in its crystal structure and crystal axes are oriented in the same direction in any portion. That is, the single crystal semiconductor substrate may have a few defects.

In this embodiment mode, the single crystal substrate 110 is processed after the base substrate 100 is processed; however, such a description is made for the sake of convenience and the present invention is not interpreted as being limited to this order. Specifically, the base substrate 100 may be processed after the single crystal semiconductor substrate 110 is processed, or the base substrate 100 and the single crystal semiconductor substrate 110 may be processed in parallel.

After the single crystal semiconductor substrate 110 is cleaned, an insulating layer 112 is formed on a surface of the single crystal semiconductor substrate 110. A structure without providing the insulating layer 112 may be employed; however, it is preferable to provide the insulating layer 112 so as to prevent contamination and damage to the surface of the single crystal semiconductor substrate 110 in later ion irradiation. The thickness of the insulating layer 112 is preferably greater than or equal to 10 nm and less than or equal to 400 nm.

As a material for forming the insulating layer 112, an insulating material containing silicon or germanium as its component such as silicon oxide, silicon nitride, silicon oxynitride, silicon nitride oxide, germanium oxide, germanium nitride, germanium oxynitride, or germanium nitride oxide can be used. Further, a metal oxide such as aluminum oxide, tantalum oxide, or hafnium oxide; a metal nitride such as aluminum nitride; a metal oxynitride such as aluminum oxynitride; or a metal nitride oxide such as aluminum nitride oxide can be used as well. As a method for forming the insulating layer 112, a CVD method, a sputtering method, a method of oxidizing (or nitriding) the semiconductor substrate 110, or the like can be used.

Next, the single crystal semiconductor substrate 110 is irradiated with an ion beam 130 including ions accelerated by an electric field through the insulating layer 112, so that a damaged region 114 is formed in a region at a predetermined depth from the surface of the single crystal semiconductor substrate 110 (see FIG. 1D). The depth of the region where the damaged region 114 is formed can be controlled by the accelerating energy and the incidence angle of the ion beam 130. The damaged region 114 is formed in a region at the same or substantially the same depth as the average depth of introduced ions.

Depending on the depth at which the damaged region 114 is formed, the thickness of a semiconductor layer which is separated from the semiconductor substrate 110 is determined. The depth at which the damaged region 114 is formed is greater than or equal to 50 nm and less than or equal to 500 nm, preferably, greater than or equal to 50 nm and less than or equal to 200 nm from the surface of the single crystal semiconductor substrate 110.

In order to irradiate the single crystal semiconductor substrate 110 with ions, an ion implantation apparatus or an ion doping apparatus can be used. In an ion implantation apparatus, a source gas is excited to produce ion species, the produced ion species are mass-separated, and ion species each having certain mass is implanted in a process object. In an ion doping apparatus, a process gas is excited to produce ion species, and a process object is irradiated with the ion species without mass-separating the produced ion species. Note that, by using an ion doping apparatus provided with a mass separator, ion irradiation with mass separation can be performed in a similar manner to the ion implantation apparatus. In this specification, the use of one of the ion implantation apparatus and the ion doping apparatus is specified only in the case where one of them needs to be used in particular, whereas in the case where there is not specific description, either of them may be used to perform ion irradiation.

For example, an ion irradiation step with an ion doping apparatus can be performed in the following conditions:

Acceleration voltage: greater than or equal to 10 kV and less than or equal to 100 kV (preferably greater than or equal to 30 kV and less than or equal to 80 kV)

Dose: greater than or equal to $1 \times 10^{16}$ ions/cm$^2$ and less than or equal to $4 \times 10^{16}$ ions/cm$^2$ Beam current density: greater than or equal to 2 μA/cm$^2$ (preferably, greater than or equal to 5 μA/cm$^2$, and more preferably, greater than or equal to 10 μA/cm$^2$)

In the case where an ion doping apparatus is used, a gas containing hydrogen can be used for a source gas in the ion irradiation step. By using the gas containing hydrogen, H$^+$, H$_2^+$, and H$_3^+$ can be produced as ion species. In the case where the gas containing hydrogen is used as a source gas, it is preferable to perform irradiation with a larger amount of H$_3^+$. Specifically, it is preferable that H$_3^+$ ions be included at 70% or more with respect to the total amount of H$^+$, H$_2^+$, and H$_3^+$ ions in the ion beam 130. It is more preferable that the proportion of H$_3^+$ ions be 80% or more. With a high proportion of H$_3^+$ ions in this manner, the damaged region 114 can contain hydrogen at a concentration of greater than or equal to $1 \times 10^{20}$ atoms/cm$^3$. Accordingly, separation at the damaged region 114 becomes easier. By irradiation with a larger amount of H$_3^+$ ions, ion irradiation efficiency is improved compared to the case of irradiation with H$^+$ ions and/or H$_2^+$ ions. That is, ion irradiation time can be shortened. Further, since the average depth of ions can be made to be small by using H$_3^+$ ions, the damaged region 114 can be formed in a region at smaller depth from the surface of the single crystal semiconductor substrate 110.

In the case where an ion implantation apparatus is used, it is preferable to implant H$_3^+$ ions through mass separation. It is needless to say that H$_2^+$ ions may also be implanted; however, in the case where the ion implantation apparatus is used, since ion species are selected to be implanted, ion irradiation efficiency is decreased as compared to the case of using an ion doping apparatus, in some cases.

As the source gas in the ion irradiation step, instead of a gas containing hydrogen, one or more kinds of gases selected from a rare gas such as helium or argon, a halogen gas typified by a fluorine gas or a chlorine gas, and a halogen compound gas such as a fluorine compound gas (e.g., $BF_3$) can be used. When helium is used for the source gas, the ion beam 130 with high proportion of $He^+$ ions can be formed without mass separation. By using such ion beam 130, the damaged region 114 can be formed efficiently.

Further, the damaged region 114 can also be formed by performing the ion irradiation step plural times. In that case, either different source gases or the same source gas may be used for the ion irradiation steps. For example, ion irradiation may be performed using a rare gas as a source gas, and then, ion irradiation may be performed using a gas containing hydrogen as a source gas. Alternatively, an ion irradiation may be performed first using a halogen gas or a halogen compound gas, and then, ion irradiation may be performed using a gas containing a hydrogen gas.

After forming the damaged region 114, the insulating layer 112 is removed, and an insulating layer 116 is formed newly (FIG. 1E). The insulating layer 112 is removed here because the insulating layer 112 is highly likely to be damaged in the ion irradiation step. Note that in the case where the damage to the insulating layer 112 is no problem, it is not necessary to remove the insulating layer 112. In that case, a structure in which the insulating layer 116 is newly formed over the insulating layer 112, or a structure in which no insulating layer 116 is formed may be employed.

As a material for forming the insulating layer 116, an insulating material containing silicon or germanium as its component such as silicon oxide, silicon nitride, silicon oxynitride, silicon nitride oxide, germanium oxide, germanium nitride, germanium oxynitride, or germanium nitride oxide can be used. Further, a metal oxide such as aluminum oxide, tantalum oxide, or hafnium oxide; a metal nitride such as aluminum nitride; a metal oxynitride such as aluminum oxynitride; or a metal nitride oxide such as aluminum nitride oxide can be used as well. As a method for forming the insulating layer 116, a CVD method, a sputtering method, a method of oxidizing (or nitriding) the semiconductor substrate 110, or the like can be used.

The insulating layer 116 is a layer forming a bond by bonding; thus it is preferable that the surface of the insulating layer 116 have high planarilty. For example, a layer whose surface has arithmetic mean roughness of 7 nm (preferably 5 nm) or less and root-mean-square roughness of 10 nm (preferably 7 nm) or less is formed. For such an insulating layer 116, for example, a silicon oxide film formed using an organosilane gas by a chemical vapor deposition method can be used. Note that a structure illustrated in FIG. 1E is hereinafter referred to as a substrate 160 for convenience.

After that, the substrate 150 and the substrate 160 are bonded to each other (see FIG. 1F). Specifically, after surfaces of the substrate 150 and the substrate 160 are cleaned by ultrasonic cleaning or the like, the substrate 160 is placed over a support 170 so that the insulating layer 116 can be present at the top, and the substrate 150 is placed over the substrate 160 so that the insulating layer 102 can be present at the bottom. Hereinafter, the detail of the bonding is described.

Figure 2B:
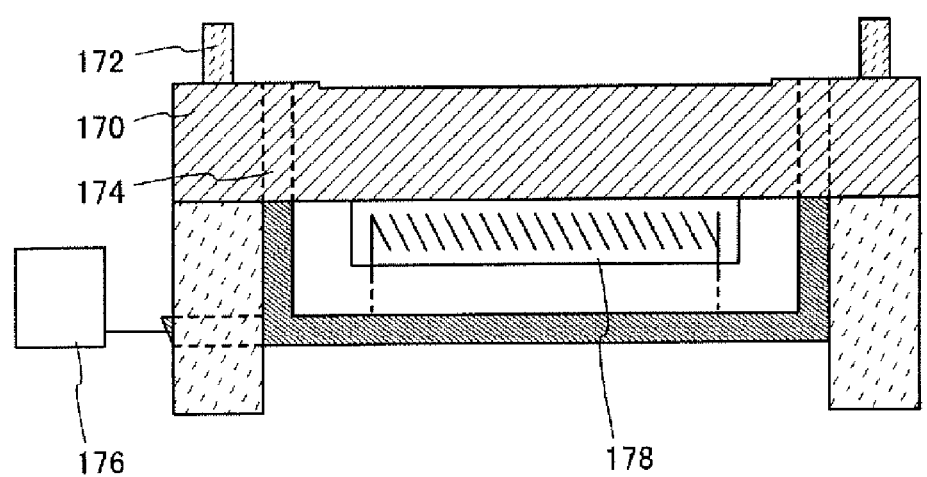

FIGS. 2A and 2B illustrate an example of an apparatus which can be used for the bonding. FIG. 2A is a plan view of the apparatus, and FIG. 2B is a cross-sectional view taken along a line A-B of FIG. 2A.

The apparatus illustrated in FIGS. 2A and 2B includes the support 170 over which the substrate 160 is placed; an airtight holding mechanism 172 provided so as to surround a region where the substrate 160 is placed; exhaust ports 174 provided in the support 170; a vacuum pump 176 connected to the exhaust ports 174; and a heat treatment means 178 (a heater). Note that the structure of the apparatus of this invention is not interpreted as being limited to the structure illustrated in FIGS. 2A and 2B. For example, if it is not necessary to perform heat treatment in bonding the substrate 150 and the substrate 160, the heat treatment means 178 is not necessarily provided. Further, a groove is formed in a region where the substrate 160 is placed; however, the groove is not necessarily formed if the substrate 160 can be fixed. Furthermore, the shape and the placement of the airtight holding mechanism 172 is not particularly limited as long as the airtight holding mechanism 172 is provided to surround the region where the substrate 160 is placed. Similarly, the shape, the placement and the like of the exhaust ports 174 can also be changed as appropriate.

Figure 3A:
FIGS. 3A to 3D illustrate a manner of bonding substrates.

Next, a procedure of the bonding using the apparatus illustrated in FIGS. 2A and 2B is described with reference to FIGS. 3A to 3D. First, the substrate 160 is placed in a groove of the support 170 (see FIG. 3A). FIG. 3A is a cross-sectional view taken along a line A-B of FIG. 3D. Here, the airtight holding mechanism 172 has an uppermost part located at a higher position than the surface of the substrate 160. Note that it is preferable that surfaces of the support 170 and the airtight holding mechanism 172 be cleaned in advance so as to prevent contamination of the substrate 150 and the substrate 160 in the bonding steps.

Figure 3B:
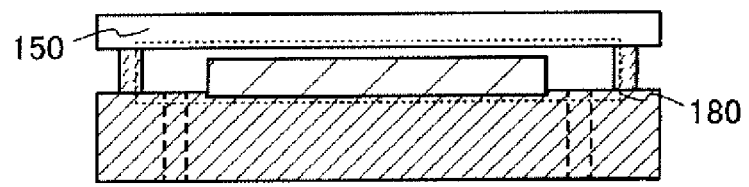

After that, the substrate 150 is placed over the airtight holding mechanism 172 (see FIG. 3B). Here, it is preferable that the airtight holding mechanism 172 have an elastic body in at least a part. For example, by making a contact portion with the substrate 150 the elastic body, adhesion between the substrate 150 and the airtight holding mechanism 172 is improved. A material which can be used as the elastic body is not particularly limited; however, the material needs to withstand later heat treatment. For example, a material which can withstand heat treatment at, at least, approximately 200° C., preferably approximately 300° C. is preferably used. Further, a material which does not contain an organic material which becomes a contaminant source of a semiconductor, or a material which hardly becomes a contaminant source even if it contains an organic material is preferably used. As examples of such a material, silicone rubber, fluorine-based rubber, perfluoro-rubber, and the like can be given. In this embodiment mode, a case where the airtight holding mechanism 172 is formed of only the elastic body is described.

Figure 3C:
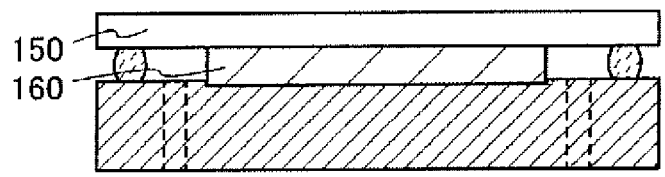
Figure 3D:
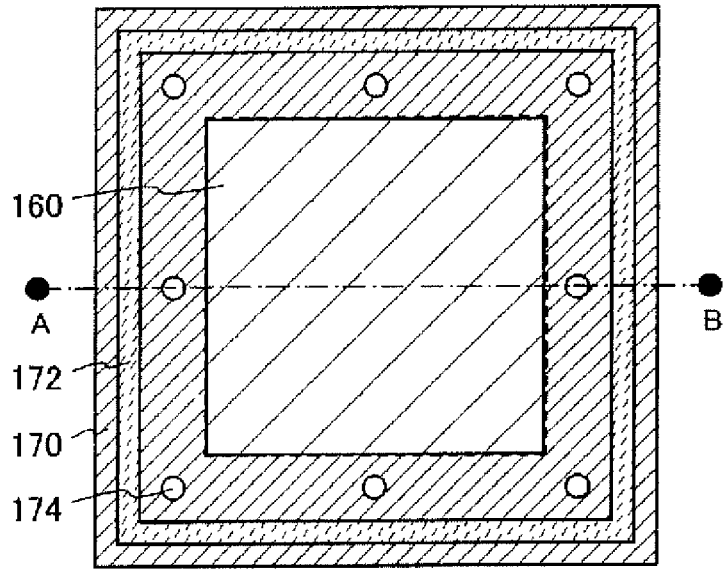

Next, a space 180 which is surrounded by the substrate 150, the support 170 and the airtight holding mechanism 172 is evacuated using a vacuum pump (see FIGS. 3B and 3C). In this embodiment mode, because the airtight holding mechanism 172 is formed of only the elastic body, distortion of the airtight holding mechanism 172 is increased as the pressure in the space 180 is decreased, and a position of the substrate 150 is lowered. That is, with difference in pressure between the space 180 and the outside, force acts in a direction where the substrate 150 and the substrate 160 come to be in contact with each other.

At this time, it is necessary that the airtight holding mechanism 172 have a certain level of hardness to reduce the pressure in the space 180 sufficiently. This is because possibility that the substrate 150 and the substrate 160 come to be in contact with each other before the pressure in the space 180 is sufficiently reduced and a bonding defect is generated becomes high if the airtight holding mechanism 172 is too soft. The hardness of the airtight holding mechanism 172 is preferably set so that the substrate 150 and the substrate 160 come to be in contact with each other when the pressure in the space 180 reaches less than or equal to 100 hPa, preferably less than or equal to 1 hPa. Note that fracture strength of a glass substrate with a thickness of 0.7 mm is greater than or equal to 100 MPa; thus, also in the case of using such a glass substrate as a part of the substrate 150, the substrate can sufficiently withstand an atmospheric pressure (1013 hPa).

After that, the pressure in the space 180 is reduced further so that the substrate 150 is pressed on the substrate 160. Accordingly, the substrate 150 and the substrate 160 can be boned at room temperature in a reduced-pressure atmosphere. Note that, as a bonding mechanism, a mechanism relating to van der Waals force, a mechanism relating to hydrogen bonding or the like is conceivable.

Before forming a bond, oxygen plasma treatment or ozone treatment may be performed on the surface of the substrate 150 or the substrate 160 to make the surface hydrophilic. By this treatment, hydroxyl is added to the surface of the substrate 150 or the substrate 160, so that a hydrogen bond can be formed at a bonding interface.

After that, heat treatment is performed on the substrate 150 and the substrate 160 which are bonded to each other so as to make a strong bond. It is necessary that the temperature of the heat treatment be less than or equal to an allowable temperature limit of the elastic body. For example, the heat temperature can be less than or equal to 300° C., preferably, less than or equal to 200° C. Needless to say, it is not limited to this in the case where an elastic body having a high allowable temperature limit is used. The treatment time is preferably 1 minute or more; however, optimum conditions may be set as appropriate in accordance with the relationship between processing speed and bonding strength. In this embodiment mode, heat treatment is performed at 200° C. for 2 hours.

At this time, by irradiating only a region relating to the bonding of the substrates with microwave, the substrates can also be heated locally. In this case, the elastic body itself does not come to have a very high temperature; therefore, a demanded level for the allowable temperature limit of the elastic body can be reduced. As one example, a material having an allowable temperature limit of approximately 150° C. can be used.

Note that in the case where there is no problem of bonding strength, the above-mentioned heat treatment may be omitted. In that case, a heating means is not necessarily provided for the apparatus. Furthermore, it is not necessary to consider the allowable temperature limit of the elastic body. In a structure of the present invention, an important point that needs to be taken into account is that the area of the substrate 150 is larger than that of the substrate 160.

Then, the space 180 is to be the atmospheric pressure, and the substrate 150 and the substrate 160 which are bonded to each other are taken out.

In this manner, the substrate 150 and the substrate 160 can be bonded to each other in a reduced-pressure atmosphere. Accordingly, adhesion of dust or the like in air to bonding surfaces can be reduced, and the air can be prevented from remaining on the surfaces to be bonded. That is, bonding defects can be reduced. Furthermore, because the substrate 150 is pressed on the substrate 160 with uniform force, the force required for forming a bond can be made to be uniform. That is to say, the bonding defects caused by local pressure can be reduced. In addition, because the pressure can be sufficiently-applied also to a peripheral region of the substrate, bonding in the peripheral region can be preferably performed. Furthermore, instead of reducing the pressure of the entire atmosphere relating to bonding, only the pressure of a minimum space (that is, the space 180 in this embodiment mode) relating to the bonding is reduced; thus time required for reduction of pressure can be shortened, and bonding efficiency is improved. Thus, productivity of semiconductor substrates can be enhanced. In addition, it is not necessary to separately prepare a vacuum chamber or the like, so that miniaturization of a manufacturing apparatus can be achieved.

Next, the substrate 160 is separated to the insulating layer 116 and a single crystal semiconductor layer 118, and a single crystal semiconductor substrate 120 (see FIG. 1G). The separation of the substrate 160 is performed by heat treatment. The allowable temperature limit of the base substrate 100 is used for determining the heat treatment temperature. In the case of using a glass substrate as the base substrate 100, for example, heat treatment temperature is preferably set to be greater than or equal to 400° C. and less than or equal to 650° C. However, if heat treatment is performed in a short period of time, heat treatment temperature may be greater than or equal to 400° C. and less than or equal to 700° C. In this embodiment mode, heat treatment is performed at 600° C. for 2 hours.

By performing the heat treatment as described above, the volume of minute voids formed in the damaged region 114 changes to generate a crack in the damaged region 114. As a result, the single crystal semiconductor substrate 110 is separated along the damaged region 114. Since the insulating layer 116 is bonded to the insulating layer 102, the single crystal semiconductor layer 118 separated from the single crystal semiconductor substrate 110 remains over the base substrate 100. Further, since the bonding interface between the insulating layer 102 and the insulating layer 116 is heated by this heat treatment, a covalent bond is formed at the bonding interface, so that bonding force at the bonding interface is further improved.

Through the above-described steps, the single crystal semiconductor layer 118 is formed over the base substrate 100. The semiconductor substrate has a structure in which the insulating layer 102, the insulating layer 116, and the single crystal semiconductor layer 118 are stacked over the base substrate 100 in this order.

In the semiconductor substrate formed as described above, defects due to the separation step or the ion irradiation step exist in the surface of the single crystal semiconductor layer 118, and planarity of the surface is lost. It is difficult to form a thin gate insulating layer with high withstand voltage on the surface of the single crystal semiconductor layer 118 having such a roughness. Therefore, planarization treatment is performed on the single crystal semiconductor layer 118. Further, when the defects exist in the single crystal semiconductor layer 118, treatment for reducing the defects in the single crystal semiconductor layer 118 is performed because the defects have an adverse effect on the performance and reliability of a transistor, such as increase of the localized level density at the interface between the single crystal semiconductor layer 118 and a gate insulating layer.

Figure 4A:
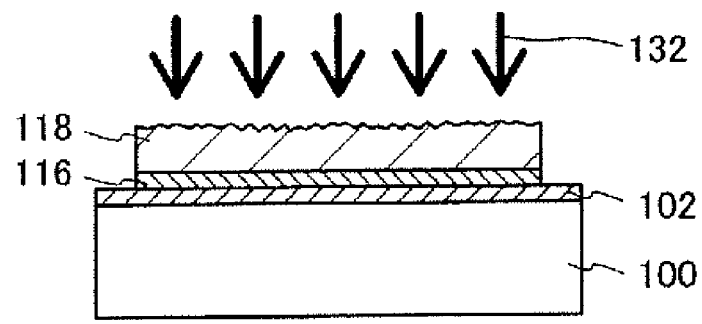
FIGS. 4A to 4C illustrate the method for manufacturing the semiconductor substrate.
Figure 4B:
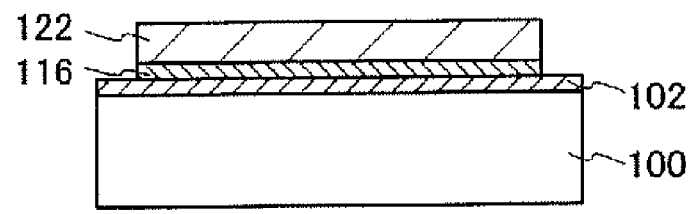
Figure 4C:
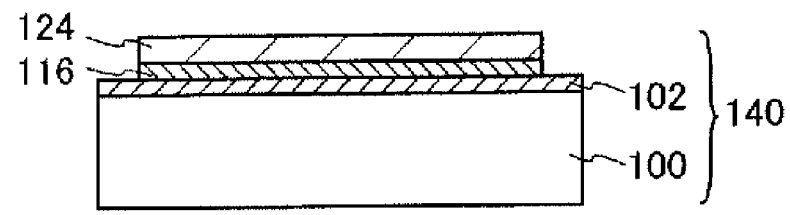

In this embodiment mode, improvement in planarity and reduction of the defects of the single crystal semiconductor layer 118 are realized by irradiation of the single crystal semiconductor layer 118 with a laser beam 132 (see FIG. 4A). By irradiating a top surface side of the single crystal semiconductor layer 118 with the laser beam 132, the top surface of the single crystal semiconductor layer 118 is melted. The single crystal semiconductor layer 118 is cooled and is solidified after being melted, thereby a single crystal semiconductor layer 122 in which planarity of a top surface thereof is improved can be obtained (see FIG. 4B). Since the laser beam 132 is used in this embodiment mode, the base substrate 100 does not need to be heated, so that temperature rise of the base substrate 100 can be suppressed. Therefore, a low-heat-resistant substrate such as a glass substrate can be used as the base substrate 100. It is needless to say that heat treatment at a temperature under the allowable temperature limit of the base substrate may be performed. By heating the base substrate, even in the case of using a laser beam having comparatively low energy density, the defects can effectively be reduced. On the other hand, the defects cannot effectively be reduced only by heat treatment at a temperature approximately less than or equal to 650° C.; therefore, laser beam irradiation is required in such a temperature condition.

Note that it is necessary that the single crystal semiconductor layer 118 be partially melted by the irradiation with the laser beam 132. This is because, if the single crystal semiconductor layer 118 is completely melted, the single crystal semiconductor layer 118 is microcrystallized due to disordered nucleation in the single crystal semiconductor layer 118 in a liquid phase, so that crystallinity is lowered. On the other hand, by partial melting, crystal growth proceeds from a solid-phase part of the single crystal semiconductor layer 118, which is not melted. Accordingly, the defects of the single crystal semiconductor layer 118 can be reduced. Note that complete melting refers that the single crystal semiconductor layer 118 is melted to the interface between the single crystal semiconductor layer 118 and the insulating layer 116 to be made in a liquid state. On the other hand, a partial melting means that the upper portion of the single crystal semiconductor layer 118 is melted to be in a liquid phase whereas the lower portion thereof is kept in a solid phase without being melted.

For the laser beam irradiation, a pulsed laser is preferably used. This is because pulsed laser light having high energy can be emitted momentarily, so that a partial melting state can be easily made. It is preferable that the repetition rate of the pulsed laser be approximately greater than or equal to 1 Hz and less than or equal to 10 MHz, more preferably, greater than or equal to 10 Hz and less than or equal to 1 MHz. As the pulsed laser, the following can be used: an Ar laser, a Kr laser, an excimer (ArF, KrF, or XeCl) laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a copper vapor laser, a gold vapor laser, or the like. It is preferable that a pulsed laser be used for partial melting; however, the present invention is not limited thereto. That is, the use of a continuous-wave laser is not excluded. As the continuous-wave laser, the following can be used: an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a helium-cadmium laser, or the like.

It is necessary that the wavelength of the laser beam 132 be set to a wavelength which can be absorbed by the single crystal semiconductor layer 118. The wavelength may be determined in consideration of the skin depth of the laser beam or the like. For example, the wavelength can be set in the range of greater than or equal to 250 nm and less than or equal to 700 nm. Further, the energy density of the laser beam 132 can be determined in consideration of the wavelength of the laser beam 132, the skin depth of the laser beam, the thickness of the single crystal semiconductor layer 118, or the like. For example, the energy density of the laser beam 132 may be set in the range of greater than or equal to 300 $mJ/cm^2$ and less than or equal to 800 $mJ/cm^2$. Note that the above range of the above energy density is an example of the case of using a XeCl excimer laser (with a wavelength of 308 nm) as the pulsed laser.

Note that, when the thickness of the single crystal semiconductor layer 118 is set to greater than or equal to a certain value (e.g., greater than or equal to 50 nm) by controlling the depth of ions that are introduced in the ion irradiation step, control of the energy density of the laser beam 132 becomes easy. Accordingly, improvement of surface planarity of the single crystal semiconductor layer and reduction of the defects can be realized effectively by irradiation with the laser beam 132 with a high yield. Note that, since the energy density of the laser beam 132 needs to be higher in the case where the thickness of the single crystal semiconductor layer 118 is too thick, the thickness of the single crystal semiconductor layer 118 is preferably less than or equal to 200 nm.

The irradiation with the laser beam 132 can be performed in an atmosphere containing oxygen such as an air atmosphere, or an inert atmosphere such as a nitrogen atmosphere. In order to perform irradiation with the laser beam 132 in an inert atmosphere, the irradiation with the laser beam 132 may be performed in an airtight chamber while the atmosphere in the chamber may be controlled. In the case where the chamber is not used, a nitrogen atmosphere can be formed by spraying an inert gas such as a nitrogen gas to the surface which is to be irradiated with the laser beam 132.

Note that performing the irradiation in the inert atmosphere such as nitrogen has higher effect of improving planarity of the single crystal semiconductor layer 118 than performing the irradiation in the air atmosphere. In addition, the inert atmosphere has higher effect of suppressing generation of cracks and ridges than the air atmosphere, and the applicable range of energy density for the laser beam 132 is widened. Note that the irradiation with the laser beam 132 may be performed in a vacuum. When the irradiation with the laser beam 132 is performed in a vacuum, effect similar to that produced by performing the irradiation in the inert atmosphere can be obtained.

After performing the irradiation with the laser beam 132 as described above, a thinning step in which the single crystal semiconductor layer 122 is thinned may be performed. In order to thin the single crystal semiconductor layer 122, either dry etching or wet etching or a combination of the both kinds of etching (etch-back treatment) may be performed. For example, when the single crystal semiconductor layer 122 is a layer made of a silicon material, the single crystal semiconductor layer 122 can be thinned by dry etching treatment using $SF_6$ and $O_2$ as a process gas. As described above, a semiconductor substrate 140 having a thin single crystal semiconductor layer 124 can be manufactured (see FIG. 4C).

Note that, although the etching treatment is performed after the surface of the semiconductor layer 118 is planarized by laser beam irradiation in this embodiment mode, the present invention is not limited thereto. For example, etching treatment may be performed before laser beam irradiation. In this case, roughness or defects of the surface of the semiconductor layer can be reduced to some extent by the etching treatment. Alternatively, etching treatment may be performed before and after the laser beam irradiation. Further alternatively, the laser beam irradiation and etching treatment may be alternately repeated. By using laser beam irradiation and etching treatment in combination as described above, roughness, defects, and the like of the surface of the semiconductor layer can be significantly reduced.

Furthermore, in performing irradiation with the laser beam 132, or before or after performing irradiation with the laser beam 132, heat treatment at a temperature less than or equal to the allowable temperature limit of the base substrate 100 may be performed. Accordingly, effect by irradiation with the laser beam 132 is promoted and thus, defects can be removed effectively and planarity can be improved. It is needless to say that the above-described etching treatment, the heat treatment, or the like does not always need to be used. In addition to the above-described etching treatment, the heat treatment, and the like, or instead of the above-described etching treatment, the heat treatment, and the like, planarization by CMP can also be performed.

With the use of the method illustrated in this embodiment mode, a semiconductor substrate provided with a single crystal semiconductor layer over a base substrate can be manufactured.

As described above, in a method for manufacturing a semiconductor substrate, substrates are bonded in a reduced-pressure. Accordingly, adhesion of dust or the like in air to bonding surfaces can be reduced, and the air can be prevented from remaining on the surfaces to be bonded. That is, generation of voids can be suppressed. Further, in the method for manufacturing a semiconductor substrate of the present invention, bonding is performed by disposing the substrates in close contact with each other using difference in pressure. Accordingly, pressure to be applied to the substrates can be uniform, whereby bonding can be preferably performed. Furthermore, by using the difference in pressure, enough pressure for bonding can be applied.

In addition, in the present invention, a minimum space relating to the bonding is evacuated; therefore, it is not necessary to separately prepare a vacuum chamber or the like, and miniaturization of a apparatus is easily achieved. Furthermore, since only the minimum space is evacuated, efficiency in evacuation is improved. That is, a semiconductor substrate can be manufactured efficiently.

The semiconductor substrate using the manufacturing method of the present invention has uniform characteristics and high productivity. Therefore, in the case of using the semiconductor substrate provided according to the present invention, a semiconductor device having superior performance can be provided at low cost. Furthermore, by using the manufacturing apparatus of the present invention, the manufacturing method of the present invention can be realized easily.

Note that in this embodiment mode, a method for manufacturing a semiconductor substrate with ion irradiation and heat separation is described; however, the method for manufacturing the semiconductor device of the invention is not limited hereto. Because the present invention provides a method by which substrates can be preferably bonded to each other, the present invention is applicable to any method for manufacturing a semiconductor substrate having bonding steps.

Embodiment Mode 2

This embodiment mode describes another example of a method for manufacturing a semiconductor substrate with reference to FIGS. 5A to 5D, and FIGS. 6A and 6B. Note that in this embodiment mode, steps relating to bonding are mainly described, and description concerning the other steps is omitted here. As for the steps other than the steps relating to the bonding, for example, Embodiment Mode 1 can be referred to. Hereinafter, a step corresponding to FIG. 1F in Embodiment Mode 1 is described.

Two substrates are boned to each other after the step illustrated in FIG. 1E of Embodiment Mode 1 is completed. In this embodiment mode, a substrate 550 and a substrate 560 are used for description.

Figure 5A:
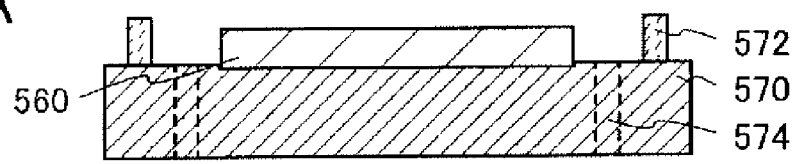
FIGS. 5A to 5D illustrate a manner of bonding substrates.

First, the substrate 560 is placed in a groove of a support 570 (see FIG. 5A). Similarly to the manufacturing apparatus in Embodiment Mode 1, the support 570 is provided with an airtight holding mechanism 572, exhaust ports 574, and the like. Here, the airtight holding mechanism 572 has an uppermost part located at a higher position than the surface of the substrate 560. Note that it is preferable that surfaces of the support 570 and the airtight holding mechanism 572 be cleaned in advance so as to prevent contamination of the substrate 550 and the substrate 560 in the bonding steps.

Figure 5B:
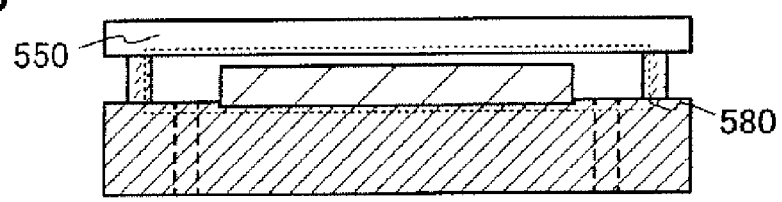

After that, the substrate 550 is placed over the airtight holding mechanism 572 (see FIG. 5B). Here, it is preferable that the airtight holding mechanism 572 have an elastic body in at least a part. For example, by making a contact portion with the substrate 550 the elastic body, adhesion between the substrate 550 and the airtight holding mechanism 572 is improved. A material which can be used as the elastic body is not particularly limited; however, the material needs to withstand later heat treatment. For example, a material which can withstand the heat treatment at, at least, approximately 200° C., preferably approximately 300° C. is preferably used. Further, a material which does not contain an organic material which becomes a contaminant source of a semiconductor, or a material which hardly becomes a contaminant source even if it contains an organic material is preferably used. As examples of such a material, silicone rubber, fluorine-based rubber, perfluoro-rubber, and the like can be given. In this embodiment mode, a case where the airtight holding mechanism is formed of the elastic body is described.

A feature of the bonding illustrated in FIGS. 5A to 5D is that the airtight holding mechanism 572 is not formed of one material. That is, materials used for the airtight holding mechanism 572 are partially different from each other. Alternatively, the composition of the materials forming the airtight holding mechanism 572 may vary little by little. With such a structure, hardness of the airtight holding mechanism 572 can be changed depending on its position. In other words, even in the case where the same pressure is applied, because the degree of distortion is different, the substrates can be bonded from a selected region.

Figure 5C:

Next, a space 580 which is surrounded by the substrate 550, the support 570 and the airtight holding mechanism 572 is evacuated using an exhaust pump (see FIGS. 5B and 5C). In this embodiment mode, because the airtight holding mechanism 572 is formed of only the elastic body, distortion of the airtight holding mechanism 572 is increased as the pressure in the space 580 is decreased, and a position of the substrate 550 is lowered. That is, with difference of pressure between the space 580 and the outside, force acts in a direction where the substrate 550 and the substrate 560 come to be in contact with each other. In this embodiment mode, the airtight holding mechanism 572 on the left side of the drawing is formed of a harder material than that of the airtight holding mechanism 572 on the right side. Therefore, the level of distortion of the airtight holding mechanism 572 on the right side of the drawing is increased, and the right side of the substrate 550 comes to be in contact with the substrate 560 first.

It is necessary that the airtight holding mechanism 572 have a certain level of hardness to reduce the pressure in the space 580 sufficiently. This is because possibility that the substrate 550 and the substrate 560 come to be in contact with each other before the pressure in the space 580 is sufficiently reduced and a bonding defect is generated becomes high if the airtight holding mechanism 572 is too soft. The hardness of the airtight holding mechanism 572 is preferably set so that the substrate 550 and the substrate 560 come to be in contact with each other when the pressure in the space 580 reaches less than or equal to 100 hPa, preferably less than or equal to 1 hPa.

Figure 5D:

After that, the pressure in the space 580 is further reduced so that the entire surface of the substrate 560 is pressed to the substrate 550 (see FIG. 5D). Through the above steps, the substrate 550 and the substrate 560 can be boned at room temperature in a reduced-pressure atmosphere. Note that, as a bonding mechanism, a mechanism relating to van der Waals force, a mechanism relating to hydrogen bonding, or the like is conceivable.

Before forming a bond, oxygen plasma treatment or ozone treatment may be performed on the surface of the substrate 550 or the substrate 560 to make the surface hydrophilic. By this treatment, hydroxyl is added to the surface of the substrate 550 or the substrate 560, so that a hydrogen bond can be formed at a bonding interface.

After that, heat treatment is performed on the substrate 550 and the substrate 560 which are bonded so as to make a strong bond. It is necessary that the temperature of the heat treatment be less than or equal to an allowable temperature limit of the elastic body. For example, the heat temperature can be less than or equal to 300° C., preferably, less than or equal to 200° C. Needless to say, it is not limited to this in the case where an elastic body having a high allowable temperature limit is used. The treatment time is preferably 1 minute or more; however, optimum conditions may be set as appropriate in accordance with the relationship between processing speed and bonding strength. In this embodiment mode, heat treatment is performed at 200° C. for 2 hours.

At this time, by irradiating only a region relating to the bonding of the substrates with microwave, the substrates can also be heated locally. In this case, the elastic body itself does not come to have a very high temperature; therefore, a demanded level for the allowable temperature limit of the elastic body can be reduced. As one example, a material having an allowable temperature limit of approximately 150° C. can be used.

Note that in the case where there is no problem of bonding strength, the above-mentioned heat treatment may be omitted. In that case, a heating means is not necessarily provided for the apparatus. Furthermore, it is not necessary to consider the allowable temperature limit of the elastic body. In a structure of the present invention, an important point that needs to be taken into account is that the area of the substrate 550 needs to be larger than that of the substrate 560.

Then, the space 580 is to be the atmospheric pressure, and the substrate 550 and the substrate 560 which are bonded to each other are taken out.

In this manner, the substrate 550 and the substrate 560 can be bonded to each other in a reduced-pressure atmosphere. Accordingly, adhesion of dust or the like in air to bonding surfaces can be reduced, and the air can be prevented from remaining on the surfaces to be bonded. The bonding defects can be reduced because drastic change in pressure does not occur. In addition, because the pressure can be sufficiently applied also to a peripheral region of the substrate, bonding in the peripheral region can be preferably performed. Furthermore, instead of reducing the pressure of the entire atmosphere relating to bonding, only the pressure of a minimum space (that is, the space 580 in this embodiment mode) relating to the bonding is reduced; thus time required for reduction of pressure can be shortened, and bonding efficiency is improved. Thus, productivity of semiconductor substrates can be enhanced. In addition, it is not necessary to separately prepare a vacuum chamber or the like, so that miniaturization of a manufacturing apparatus is easily achieved.

Further, as described in this embodiment mode, by selecting a start region for the bonding, defects resulting from starting the bonding from a plurality of regions can be suppressed.

Note that, in FIGS. 5A to 5D, the case is illustrated where the degree of distortion is varied by changing the material and the start region for the bonding is selected; however, the present invention is not limited to this. For example, by making each the width or the height of the airtight holding mechanism 572 different depending on its position, even if the airtight holding mechanism 572 is formed of one kind of material, the start region for bonding can be selected.

Figure 6A:
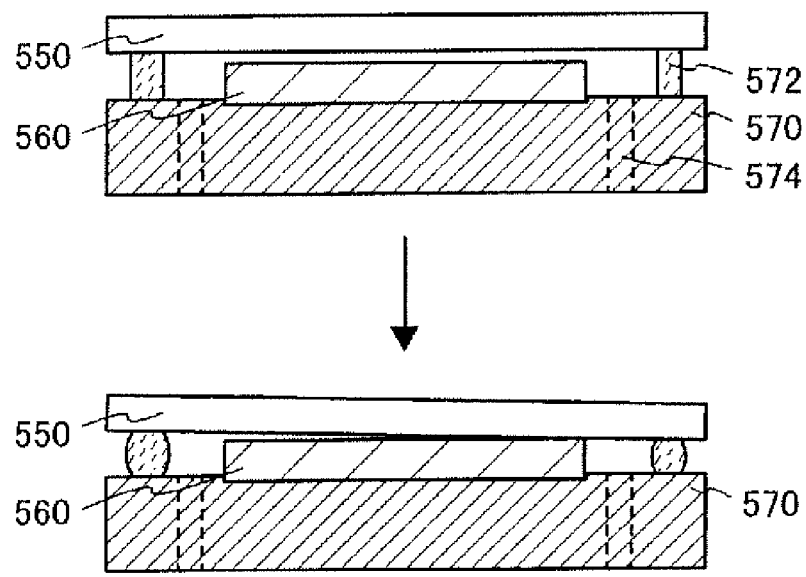
FIGS. 6A and 6B illustrate a manner of bonding substrates.

Here, the case where the width of the airtight holding mechanism 572 varies depending on the place is illustrated in FIG. 6A. Specifically, the property that the distortion is small in the case where the width of the airtight holding mechanism 572 is large, whereas the distortion is large in the case where the width of the airtight holding mechanism 572 is small is utilized. Thus, the bonding can be started from a vicinity of a region where the airtight holding mechanism 572 with a small width is placed.

Figure 6B:
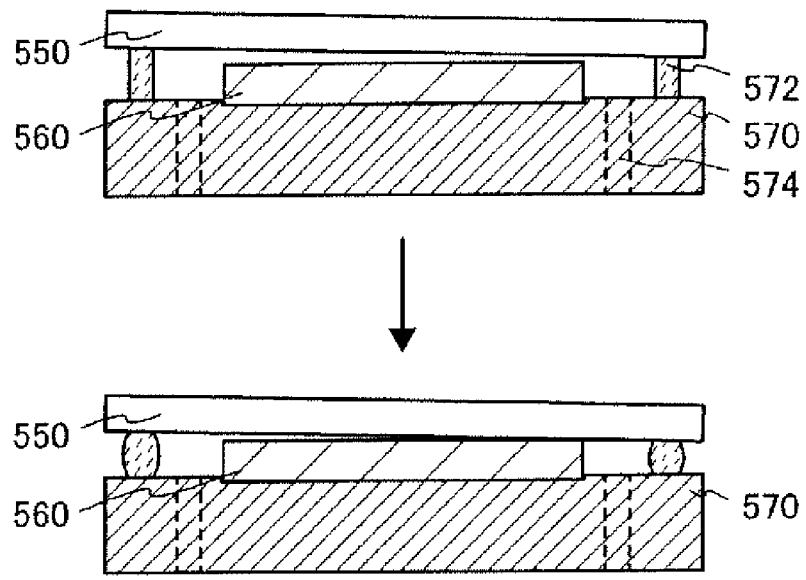

Similarly, the case where the height of the airtight holding mechanism 572 varies is illustrated in FIG. 6B. Specifically, even in the case where the degree of the distortion of the airtight holding mechanism 572 is almost the same, by changing the initial height, the region where the substrates come to be in contact with each other can be selected.

This embodiment mode can be used in combination with Embodiment Mode 1.

Embodiment Mode 3

This embodiment mode describes another example of a method for manufacturing a semiconductor substrate with reference to FIGS. 7A to 7D, and FIGS. 8A to 8C. Note that in this embodiment mode, only the steps relating to bonding are described; however, description concerning the other steps is omitted here. As for the steps other than the steps relating to the bonding, for example, Embodiment Mode 1 can be referred to. Hereinafter, a step corresponding to FIG. 1F of Embodiment Mode 1 is described.

Two substrates are boned to each other after the step illustrated in FIG. 1E of Embodiment Mode 1 is completed. In this embodiment mode, a substrate 750 and a substrate 760 are used for description.

Figure 7A:
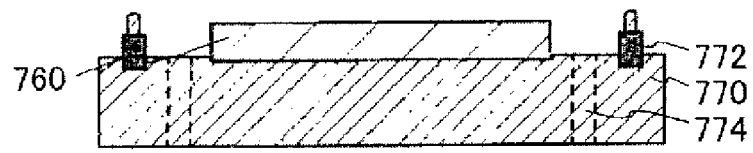
FIGS. 7A to 7D illustrate a manufacturing apparatus of a semiconductor substrate.

First, the substrate 760 is placed in a groove of a support 770 (see FIG. 7A). FIG. 7A is a cross-sectional view taken along a line A'-B' of FIG. 7D. Similarly to the manufacturing apparatus in Embodiment Mode 1, the support 770 is provided with an airtight holding mechanism 772, exhaust ports 774, and the like. Here, the airtight holding mechanism 772 has an uppermost part located at a higher position than the surface of the substrate 760. Note that it is preferable that surfaces of the support 770 and the airtight holding mechanism 772 be cleaned in advance so as to prevent contamination of the substrate 750 and the substrate 760 in the bonding steps.

The difference of this embodiment mode from Embodiment Mode 1 and Embodiment Mode 2 is that the airtight holding mechanism 772 includes a material other than the elastic body. Accordingly, bonding of the present invention can be realized without depending solely on the material of the elastic body. That is, the airtight holding mechanisms in Embodiment Mode 1 and Embodiment Mode 2 directly use the property of the material, while the airtight holding mechanism 772 in this embodiment mode is different from the other embodiment modes in that the bonding of the present invention is realized by functional characteristics of the mechanism.

Figure 8A:
FIGS. 8A to 8C illustrate a structure of an airtight holding mechanism.
Figure 8B:
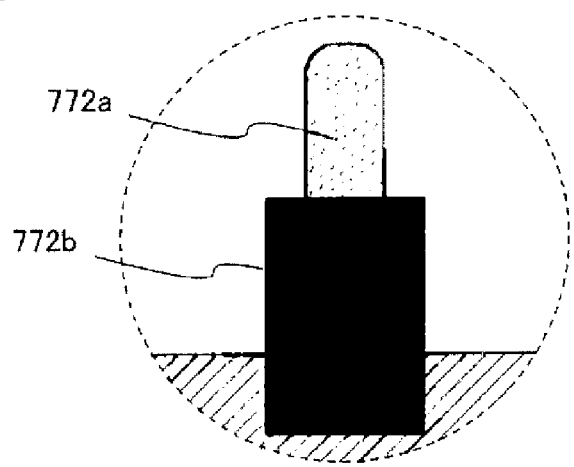
Figure 8C:
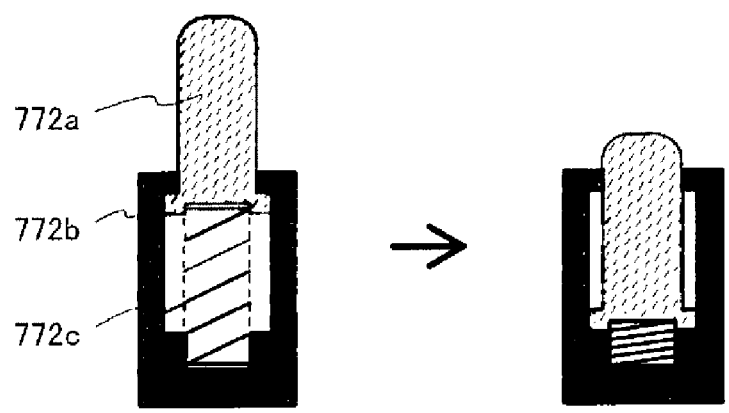

With the use of FIGS. 8A to 8C, an example of a structure of the airtight holding mechanism 772 in this embodiment mode is described. FIG. 8A is a diagram schematically illustrating a cross section of the support 770 including the airtight holding mechanism 772. FIG. 8B is an enlarged view of the airtight holding mechanism 772. The airtight holding mechanism 772 includes a movable portion 772a and a fixed portion 772b. In this embodiment mode, the case where the entire movable portion 772a is formed of the elastic body so that airtightness is ensured; however, the present invention is not construed as being limited thereto. For example, only an upper part of the movable portion 772a (a portion to be in contact with the substrate 750 later) may be formed of the elastic body, and the other part may be formed of an inelastic body. Alternatively, the structure of the airtight holding mechanism 772 may have another structure. This is because an important point in this embodiment mode is that the airtight holding mechanism 772 having the movable portion is used, and is not a detail of the structure of the airtight holding mechanism 772. Further, the fixed portion 772b is embedded in the support 770, and contributes to retaining airtightness and relieves restriction of the size of the airtight holding mechanism 772.

FIG. 8C illustrates an example of an internal structure of the airtight holding mechanism 772. The inside of the fixed portion 772b has a hollow structure, thereby changing the position of the movable portion 772a in a height direction. Further, an elastic body 772c for controlling the position of the movable portion 772a is connected to the movable portion 772a. The distance between the movable portion 772a and the fixed portion 772b is kept constant with the elastic body 772c in a circumstance where external force is not applied. Furthermore, the position of the movable portion 772a is changed corresponding to the force applied to the movable portion 772a. In this embodiment mode, a coil spring is used as an example of the elastic body 772c; however, the present invention is not limited to this, and another elastic body may be used. Still furthermore, any substance other than the elastic body can be used as appropriate if it exhibits a property of restoring the movable portion 772a to the original position. For example, a gas may be enclosed in a region surrounded by the movable portion 772a and the fixed portion 772b so as to be used in place of the elastic body.

Alternatively, a gas or a liquid may be injected into the fixed portion 772b using an external mechanism such as what is called a hydraulic cylinder, so that the position of the movable portion may be controlled. In that case, because restoring force is not necessarily used, difference of pressure in bonding can be changed. That is, the degree of reduction of pressure and the force to be applied in bonding can be set as appropriate. Note that in this structure, a tube for introducing a gas or a liquid is required so as to inject the gas or the liquid from the outside, and a mechanism for delivering the gas or the liquid is also needed. In this respect, it can be said that the structure of the airtight holding mechanism 772 is complicated to some extent.

Figure 7B:
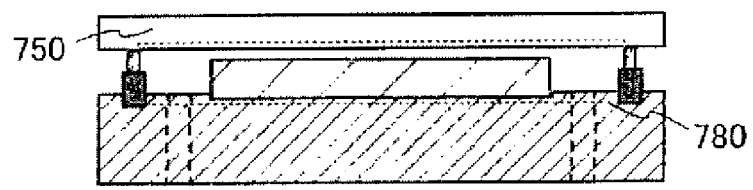

After the substrate 760 is placed over the support 770, the substrate 750 is placed over the airtight holding mechanism 772 (see FIG. 7B). More precisely, the substrate 750 is placed so as to be in contact with an upper portion of the movable portion of the airtight holding mechanism 772. Here, the airtight holding mechanism 772 has a structure described in FIGS. 8A to 8C. As illustrated in this embodiment mode, by making the contact portion with the substrate 750 an elastic body, adhesion between the substrate 750 and the airtight holding mechanism 772 can be improved. A material which can be used as the elastic body is not particularly limited; however, the material needs to withstand later heat treatment. For example, a material which can withstand the heat treatment at, at least, approximately 200° C., preferably approximately 300° C. is preferably used. Further, a material which does not contain an organic material which becomes a contaminant source of a semiconductor, or a material which hardly becomes a contaminant source even if it contains an organic material is preferably used. As examples of such a material, silicone rubber, fluorine-based rubber, perfluororubber, and the like can be given.

Figure 7C:
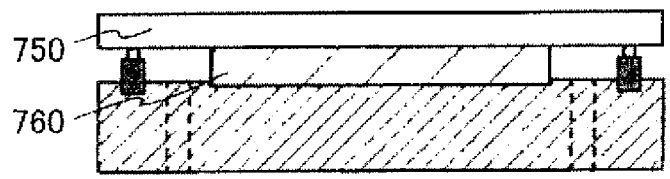

Next, a space 780 which is surrounded by the substrate 750, the support 770 and the airtight holding mechanism 772 is evacuated using an exhaust pump (see FIGS. 7B and 7C). In this embodiment mode, since the airtight holding mechanism 772 has the structure described in FIGS. 8A to 8C, when the pressure in the space 780 is decreased, the position of the movable portion of the airtight holding mechanism 772 is lowered, and the position of the substrate 750 is lowered. That is, with difference of pressure between the space 780 and the outside, force acts in a direction where the substrate 750 and the substrate 760 come to be in contact with each other.

It is necessary that the airtight holding mechanism 772 have restoring force above a certain level to reduce the pressure in the space 780 sufficiently. This is because possibility that the substrate 750 and the substrate 760 come to be in contact with each other before the pressure in the space 780 is sufficiently reduced and a bonding defect is generated becomes high if the airtight holding mechanism 772 has too weak restoring force. The restoring force of the airtight holding mechanism 772 is preferably set so that the substrate 750 and the substrate 760 come to be in contact with each other when the pressure in the space 780 reaches less than or equal to 100 hPa, preferably less than or equal to 1 hPa. In the case where an external mechanism such as what is called a hydraulic cylinder is used as the airtight holding mechanism 772, it is preferably adjusted so that the substrate 750 and the substrate 760 come to be in contact with each other when the pressure in the space 780 reaches less than or equal to 100 hPa, preferably less than or equal to 1 hPa.

Figure 7D:
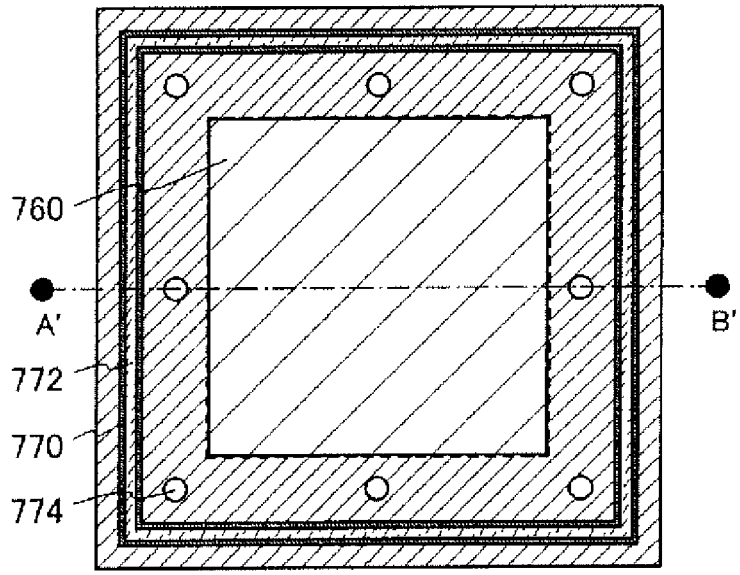

After that, the pressure in the space 780 is further reduced so that entire surface of the substrate 760 is pressed to the substrate 750 (see FIG. 7D). Through the above steps, the substrate 750 and the substrate 760 can be boned at room temperature in a reduced-pressure atmosphere. Note that, as a bonding mechanism, a mechanism relating to van der Waals force, a mechanism relating to hydrogen bonding, or the like is conceivable.

Before forming a bond, oxygen plasma treatment or ozone treatment is performed on the surface of the substrate 750 or the substrate 760 to make the surface hydrophilic. By this treatment, hydroxyl is added to the surfaces of the substrate 750 or the substrate 760, so that a hydrogen bond can be formed at a bonding interface.

After that, heat treatment is performed on the substrate 750 and the substrate 760 which are bonded to make a strong bond. It is necessary that the temperature of the heat treatment be equal to or lower than an allowable temperature limit of the elastic body. For example, the heat temperature can be equal to or lower than 300° C., preferably, equal to or lower than 200° C. Needless to say, it is not limited to this in the case where an elastic body having a high allowable temperature limit is used. The treatment time is preferably 1 minute or more; however, optimum conditions may be set as appropriate in accordance with the relationship between processing speed and bonding strength. In this embodiment mode, heat treatment is performed at 200° C. for 2 hours.

At this time, by irradiating only a region relating to the bonding of the substrates with microwave, the substrates can also be heated locally. In this case, the elastic body itself does not come to have a very high temperature; therefore, a demanded level for the allowable temperature limit of the elastic body can be reduced. As one example, a material having an allowable temperature limit of approximately 150° C. can be used.

Note that in the case where there is no problem of bonding strength, the above-mentioned heat treatment may be omitted. In that case, a heating means is not necessarily provided for the apparatus. Furthermore, it is not necessary to consider the allowable temperature limit of the elastic body. In a structure of the present invention, an important point that needs to be taken into account is that the area of the substrate 750 needs to be larger than that of the substrate 760.

Then, the space 780 is to be the atmospheric pressure, and the substrate 750 and the substrate 760 which are bonded to each other are taken out.

In this manner, the substrate 750 and the substrate 760 can be bonded to each other in a reduced-pressure atmosphere. Accordingly, adhesion of dust or the like in air to bonding surfaces can be reduced, and the air can be prevented from remaining on the surfaces to be bonded. That is, bonding defects can be reduced. Furthermore, because the substrate 750 is pressed on the substrate 760 with uniform force, the force required for forming a bond can be made to be uniform. That is to say, the bonding defects caused by local pressure can be reduced. In addition, because the pressure can be sufficiently applied to a peripheral region of the substrate, bonding in the peripheral region can be preferably performed. Furthermore, instead of reducing the pressure of the entire atmosphere relating to bonding, only the pressure of a minimum space (that is, the space 780 in this embodiment mode) relating to the bonding is reduced, thus time required for reduction of pressure can be shortened, and bonding efficiency is improved. Thus, productivity of semiconductor substrates can be enhanced. In addition, it is not necessary to separately prepare a vacuum chamber or the like, so that miniaturization of a manufacturing apparatus is easily achieved.

Note that in this embodiment mode, the case where entire surfaces of the substrate 750 and the substrate 760 come to be in contact with each other at one time is described; however, the present invention is not limited to this. For example, as described in Embodiment Mode 2, the start region for bonding can be selected. The selection of the start region for the bonding can be realized by varying the restoring force of the elastic body 772c illustrated in FIGS. 8A to 8C according to the place. Furthermore, by varying the range of distance in which the movable portion 772a moves, the start region for the bonding can also be selected.

This embodiment mode can be combined with Embodiment Mode 1 or Embodiment Mode 2 as appropriate.

Embodiment Mode 4

In this embodiment mode, as another example of a method for manufacturing a semiconductor substrate, steps of bonding a plurality of semiconductor substrates to one base substrate is described with reference to FIGS. 9A and 9B, and FIGS. 10A to 10D. Note that in this embodiment mode, only the steps relating to bonding are described, and description concerning the other steps is omitted here. As for the steps other than the steps relating to the bonding, for example, Embodiment Mode 1 can be referred to. Note that, in bonding steps in this embodiment mode, a plurality of single crystal semiconductor substrates are used at the same time. The steps of FIGS. 1C, 1D, and 1E in Embodiment Mode 1 are repeated a plurality of times, whereby a required single crystal semiconductor substrates can be prepared. Alternatively, the steps of FIGS. 1C, 1D, and 1E may be performed in parallel. A step corresponding to FIG. 1F of Embodiment Mode 1 is described below.

After the step illustrated in FIG. 1E is completed and the plurality of the single crystal semiconductor substrates is prepared, the plurality of the single crystal semiconductor substrates is bonded to one base substrate. In this embodiment mode, a substrate 950 and a plurality of substrates 960 are used for description.

Figure 9A:
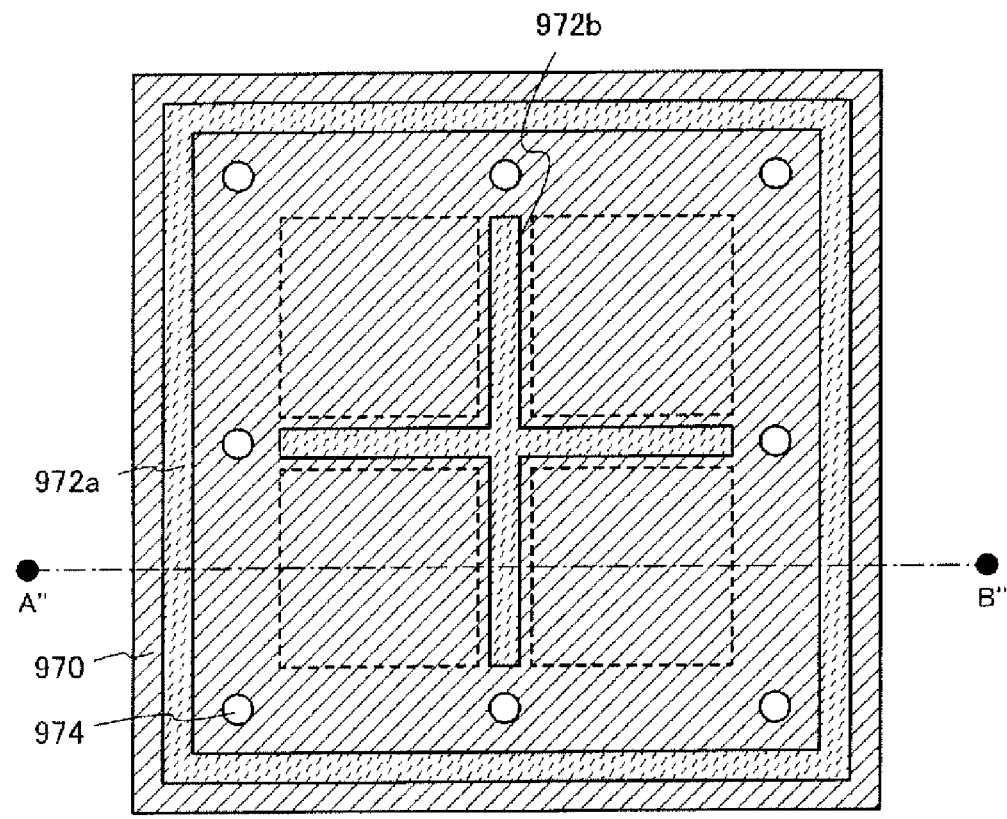
FIGS. 9A and 9B illustrate a manufacturing apparatus of a semiconductor substrate.

First, an example of an apparatus which can be used for bonding of this embodiment mode is illustrated (see FIG. 9A). FIG. 9A is a plan view of the apparatus, and FIG. 9B is a cross-sectional view taken along a line A"-B" of FIG. 9A.

Figure 9B:
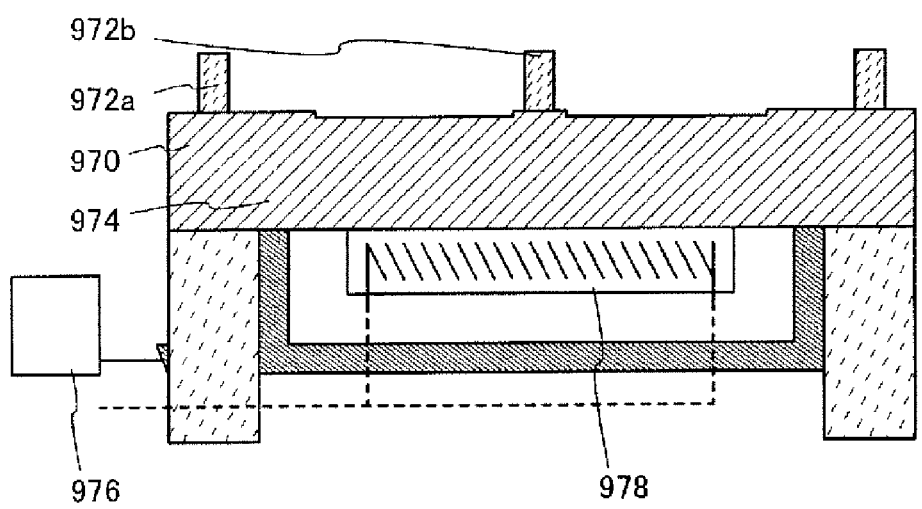

The apparatus illustrated in FIGS. 9A and 9B includues a support 970 over which the substrates 960 are placed; an airtight holding mechanism 972a provided so as to surround a region where the substrates 960 are placed; an interval holding mechanism 972b provided in a region where the substrates 960 are not placed in the region surrounded by the interval holding mechanism 972a; exhaust ports 974 provided in the, support 970; a vacuum pump 976 connected to the exhaust ports 974; and a heat treatment means 978 (a heater). Note that the structure of the apparatus of this invention is not interpreted as being limited to that illustrated in FIGS. 9A and 9B. For example, if it is not necessary to perform heat treatment in bonding the substrate 950 and the substrates 960, the heat treatment means 978 is not necessarily provided. Further, grooves are formed in regions where the substrates 960 are placed; however, the shape and the placement of the grooves are not limited to this and the grooves are not necessarily formed if the substrates 960 can be fixed. Furthermore, the shape and the placement of the airtight holding mechanism 972a are not specifically limited as long as the airtight holding mechanism 972a is provided to surround the region where the substrates 960 are placed.

Note that, in this embodiment mode, the interval holding mechanism 972b is provided. This is because when a large-sized base substrate to which the plurality of single crystal semiconductor substrates is bonded is used, the center portion of the substrate is particularly distorted due to its own weight. As a result of such a distortion, possibility that a bonding defect is caused becomes high. Therefore, in order to prevent the distortion, the interval holding mechanism 972b is provided in this embodiment mode. Note that the shape and the placement of the interval holding mechanism 972b and the exhaust ports 974 can be changed as appropriate. In the case where the distortion does not cause a problem, a structure without providing the interval holding mechanism 972b may be employed.

Figure 10A:
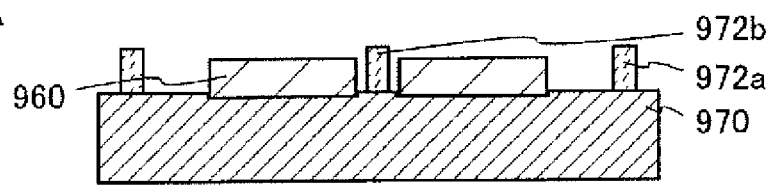
FIGS. 10A to 10D illustrate a manner of bonding substrates.

Next, a procedure of the bonding using the apparatus illustrated in FIGS. 9A and 9B is described with reference to FIGS. 10A to 10D. First, the substrates 960 are placed in grooves of the support 970 (see FIG. 10A). FIG. 10A is a cross-sectional view taken along a line A"-B" of FIG. 10D. Here, the airtight holding mechanism 972a and the interval holding mechanism 972b have uppermost parts located at a higher position than the surfaces of the substrates 960. Note that it is preferable that surfaces of the support 970, the airtight holding mechanism 972a, and the interval holding mechanism 972b be cleaned in advance so as to prevent contamination of the substrate 950 and the substrates 960 in the bonding steps.

Figure 10B:
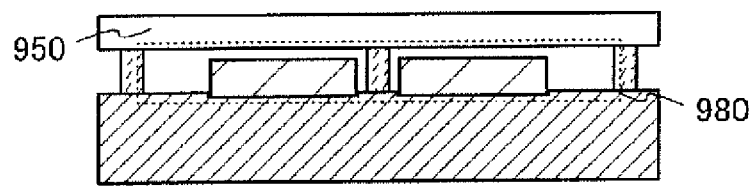

After that, the substrate 950 is placed over the airtight holding mechanism 972a and the interval holding mechanism 972b (see FIG. 10B). Here, it is preferable that the airtight holding mechanism 972a and the interval holding mechanism 972b have an elastic body in a part. For example, by making a contact portion with the substrate 950 the elastic body, adhesion between the substrate 950, and the airtight holding mechanism 972a and the interval holding mechanism 972b can be improved. A material which can be used as the elastic body is not specifically limited; however, the material needs to withstand later heat treatment. For example, a material which can withstand heat treatment at, at least, approximately 200° C., preferably approximately 300° C. is preferably used. Further, a material which does not contain an organic material which becomes a contaminant source of a semiconductor, or a material which hardly becomes a contaminant source even if it contains an organic material is preferably used. As examples of such a material, silicone rubber, fluorine-based rubber, perfluoro-rubber, and the like can be given. In this embodiment mode, the case where the airtight holding mechanism 972a and the interval holding mechanism 972b are formed of only the elastic body is described.

Figure 10C:
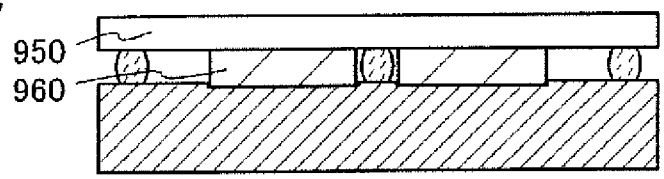
Figure 10D:
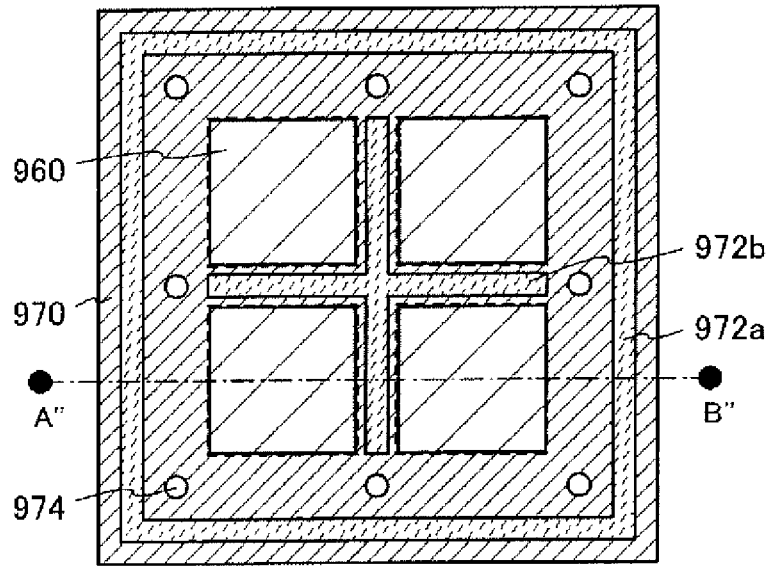

Next, a space 980 which is surrounded by the substrate 950, the support 970 and the airtight holding mechanism 972a is evacuated using a vacuum pump (see FIGS. 10B and 10C). In this embodiment mode, because the airtight holding mechanism 972a and the interval holding mechanism 972b are formed of only the elastic body, distortion of the airtight holding mechanism 972a and the interval holding mechanism 972b is increased as the pressure in the space 980 is decreased, and a position of the substrate 950 is lowered. That is, with difference in pressure between the space 980 and the outside, force acts in a direction where the substrate 950 and the substrates 960 come to be in contact with each other.

At this time, it is necessary that the airtight holding mechanism 972a and the interval holding mechanism 972b have a certain level of hardness to reduce the pressure in the space 980 sufficiently. This is because possibility that the substrate 950 and the substrates 960 come to be in contact with each other before the pressure in the space 980 is sufficiently reduced and a bonding defect is generated becomes high if the airtight holding mechanism 972a and the interval holding mechanism 972b are too soft. The hardness of the airtight holding mechanism 972a and the interval holding mechanism 972b is preferably set so that the substrate 950 and the substrates 960 come to be in contact with each other when the pressure in the space 980 reaches less than or equal to 100 hPa, preferably less than or equal to 1 hPa.

Note that in this embodiment mode, the same material is used for forming the airtight holding mechanism 972a and the interval holding mechanism 972b, and the same can be said for parameters such as the heights and the widths of the airtight holding mechanism 972a and the interval holding mechanism 972b. In addition, the interval holding mechanism 972b is placed so as to be symmetric with respect to the center point of the support 970. Thus, the distortion of the airtight holding mechanism 972a and the interval holding mechanism 972b can be approximately the same, and the substrate 950 can come to be in contact with the substrates 960 while being kept in a horizontal position. It is needless to say that the present invention should not be construed as being limited thereto. For example, the interval holding mechanism 972b can be formed using another material, and the parameters such as the heights and the widths may be different. With reference to Embodiment Mode 2 or Embodiment Mode 3, a structure in which the start region for bonding the substrate 950 and the substrates 960 is selected may be employed.

After that, the pressure in the space 980 is further reduced so that entire surfaces of the substrates 960 are pressed to the substrate 950. Through the above steps, the substrate 950 and the substrates 960 can be boned at room temperature in a reduced-pressure atmosphere. Note that, as a bonding mechanism, mechanism relating to van der Waals force, mechanism relating to hydrogen bonding, or the like is conceivable.

Before forming a bond, oxygen plasma treatment or ozone treatment may be performed on the surface of the substrate 950 or the substrates 960 to make the surface hydrophilic. By this treatment, hydroxyl is added to the surface of the substrate 950 or the substrates 960, so that a hydrogen bond can be formed at a bonding interface.

After that, heat treatment is performed on the substrate 950 and the substrates 960 which are bonded to make strong bonds. It is necessary that the temperature of the heat treatment be equal to or lower than an allowable temperature limit of the elastic body. For example, the heat temperature can be equal to or lower than 300° C., preferably, equal to or lower than 200° C. Needless to say, it is not limited to this in the case where an elastic body having high allowable temperature limit is used. The treatment time is preferably 1 minute or more; however, optimum conditions may be set as appropriate in accordance with the relationship between processing speed and bonding strength. In this embodiment mode, heat treatment is performed at 200° C. for 2 hours.

At this time, by irradiating only a region relating to the bonding of the substrates with microwave, the substrates can also be heated locally. In this case, the elastic body itself does not come to have a very high temperature; therefore, a demanded level for the allowable temperature limit of the elastic body can be reduced. As one example, a material having an allowable temperature limit of approximately 150° C. can be used.

Note that in the case where there is no problem of bonding strength, the above-mentioned heat treatment may be omitted. In that case, a heating means is not necessarily provided for the apparatus. Furthermore, it is not necessary to consider the allowable temperature limit of the elastic body.

Then, the space 980 is to be the atmospheric pressure, and the substrate 950 and the substrates 960 which are bonded to each other are taken out.

In this manner, the substrate 950 and the substrates 960 can be bonded to each other in a reduced-pressure atmosphere. Accordingly, adhesion of dust or the like in air to bonding surfaces can be reduced, and the air can be prevented from remaining on the surfaces to be bonded. That is, bonding defects can be reduced. Furthermore, because the substrate 950 is pressed on the substrates 960 with uniform force, the force required for forming a bond can be made to be uniform. That is to say, a bonding defect caused by local pressure can be reduced. In addition, because the pressure can be sufficiently applied to a peripheral region of the substrates, bonding in the peripheral region can be preferably performed. Furthermore, instead of reducing the pressure of the entire atmosphere relating to bonding, only the pressure of a minimum space (that is, the space 980 in this embodiment mode) relating to the bonding is reduced; thus time required for reduction of pressure can be shortened, and bonding efficiency is improved. Thus, productivity of semiconductor substrates can be enhanced. In addition, it is not necessary to separately prepare a vacuum chamber or the like, so that miniaturization of a manufacturing apparatus is easily achieved.

Furthermore, in this embodiment mode, the interval holding mechanism 972b prevents the distortion of the base substrate. Accordingly, even in the case where a large-sized base substrate is used, bonding can be preferably performed.

This embodiment mode can be combined with any of Embodiment Mode 1 to Embodiment Mode 3 as appropriate.

Embodiment Mode 5

This embodiment mode describes an example of a method for manufacturing a semiconductor device using a semiconductor substrate of the present invention, with reference to FIGS. 11A to 11D, FIGS. 12A to 12C, FIGS. 13A to 13C, and FIGS. 14A and 14B. Note that a liquid crystal display device is given as an example of a semiconductor device in this embodiment mode; however, a semiconductor device of the present invention is not limited to a liquid crystal display device.

First, a semiconductor substrate having a single crystal semiconductor layer manufactured by the method illustrated in Embodiment Mode 1 or the like is prepared (see FIG. 11A). Here, description is made using a structure in which an insulating layer 1102, an insulating layer 1104, and a single crystal semiconductor layer 1106 are sequentially provided over a base substrate 1100 is describe; however, the present invention is not limited thereto. Here, the insulating layer 1104 can be formed of a material such as silicon oxide, silicon nitride, silicon oxynitride, or silicon nitride oxide. Further, the insulating layer 1104 may have a stacked-layer structure. For the detailed description, Embodiment Mode 1 can be referred to.

Next, the single crystal semiconductor layer 1106 is patterned to have desired shapes, thereby forming island-shaped single crystal semiconductor layers. Note that as etching processing in patterning, either dry etching (plasma etching or the like) or wet etching can be used. For treating a large-area substrate, plasma etching is more suitable. As an etching gas, a fluorine-based gas or a chlorine-based gas such as $CF_4$, $NF_3$, $Cl_2$, or $BCl_3$ may be used, and an inert gas such as He or Ar may be added thereto as appropriate. Further, in the case of applying etching processing by atmospheric pressure discharge, local discharge processing can be realized, whereby etching can be performed without forming a mask layer over an entire surface of the substrate.

Note that it is preferable that the insulating layer 1102 and the insulating layer 1104 be not etched to remain. This is because by remaining the insulating layer 1102 and the insulating layer 1104, an impurity element (e.g., alkali metal such as sodium or potassium; alkaline earth metal such as magnesium, or calcium; or transition metal such as iron, copper, or nickel) included in the base substrate 1100 can be prevented from intruding into the single crystal semiconductor layer.

After the single crystal semiconductor layer 1106 is patterned, a p-type impurity such as boron, aluminum, or gallium may be added in order to control a threshold voltage. For example, as a p-type impurity, boron can be added at a concentration greater than or equal to $5\times10^{16}$ cm$^{-3}$ and less than or equal to $1\times10^{18}$ cm$^{-3}$.

Next, a gate insulating layer 1108 which covers the island-shaped single crystal semiconductor layers is formed (see FIG. 11B). Note that for convenience, the island-shaped single crystal semiconductor layers which are formed by patterning are referred to as single crystal semiconductor layers 1110, 1112, and 1114 here. The gate insulating layer 1108 is formed of a silicon-containing insulating film by a plasma CVD method, a sputtering method, or the like, at a thickness of approximately greater than or equal to 10 nm and less than or equal to 150 nm. In specific, the gate insulating layer 1108 may be formed from a material such as an oxide material or a nitride material of silicon, which is typified by silicon nitride, silicon oxide, silicon oxynitride, and silicon nitride oxide. Note that the gate insulating layer 1108 may have a single-layer structure or a stacked-layer structure. Further, a thin silicon oxide film with a thickness of greater than or equal to 1 nm and less than or equal to 100 nm, preferably greater than or equal to 1 nm and less than or equal to 10 nm, more preferably greater than or equal to 2 nm and less than or equal to 5 nm may be formed between the single crystal semiconductor layer and the gate insulating layer. In order to form a gate insulating film having less leakage current at low temperature, a rare gas element such as argon may be contained in a reaction gas.

Next, a first conductive film and a second conductive film, which serve as gate electrode layers, are stacked over the gate insulating layer 1108. The first conductive film may be formed at a thickness of about greater than or equal to 20 nm and less than or equal to 100 nm, and the second conductive film may be formed at a thickness of approximately greater than or equal to 100 nm and less than or equal to 400 nm. The first and second conductive films can be formed by a sputtering method, an evaporation method, a CVD method, or the like. The first and second conductive films may be formed of an element selected from tantalum, tungsten, titanium, molybdenum, aluminum, copper, chromium, neodymium, or the like; an alloy material or a compound material including any of those elements as its main component; or the like. Further, for the first and second conductive films, a semiconductor film typified by a polycrystalline silicon film doped with an impurity element such as phosphorus; an AgPdCu alloy; or the like may be used. Note that although a conductive layer with a two-layer structure is described in this embodiment mode, the present invention is not limited thereto. Alternatively, a three-layer structure or a single-layer structure may be employed.

Then, a photolithography method is used to form masks 1116a, 1116b, 1116c, 1116d, and 1116e from a resist material. Then, the first conductive film and the second conductive film are processed into a desired shape with the use of the masks to form first gate electrode layers 1118a, 1118b, 1118c, and 1118d, a first conductive layer 1118e, and conductive layers 1120a, 1120b, 1120c, 1120d, and 1120e (see FIG. 11C).

Here, an inductively coupled plasma (ICP) etching method is used, and etching conditions (e.g., the amount of electric power applied to a coiled electrode layer, the amount of electric power applied to an electrode layer on the substrate side, and the electrode temperature on the substrate side) are regulated as appropriate, whereby etching can be performed so as to obtain a desired tapered shape. An angle and the like of the tapered shape may also be controlled by the shape of the masks. Note that a chlorine-based gas typified by $Cl_2$, $BCl_3$, $SiCl_4$, $CCl_4$, or the like; a fluorine-based gas typified by $CF_4$, $SF_6$, $NF_3$, or the like; or $O_2$ can be used for the etching gas, as appropriate. In this embodiment mode, the second conductive film is etched using an etching gas containing $CF_4$, $Cl_2$, and $O_2$, and then, the first conductive film is continuously etched using an etching gas containing $CF_4$ and $Cl_2$.

Next, the conductive layers 1120a, 1120b, 1120c, 1120d, and 1120e are processed into a desired shape using the masks 1116a, 1116b, 1116c, 1116d, and 1116e. At this time, etching is performed under an etching condition in which the selectivity of the second conductive film, which forms the conductive layers, to the first conductive film, which forms the first gate electrode layers and the first conductive layer, is high. By the etching, second gate electrode layers 1122a, 1122b, 1122c, and 1122d, and a second conductive layer 1122e are formed. In this embodiment mode, each of the second gate electrode layers and the second conductive layer has a tapered shape, and a taper angle of each of the second gate electrode layers and the second conductive layer is larger than a taper angle of each of the first gate electrode layers and the first conductive layer. Here, a "taper angle" refers to an angle formed by the meeting of a bottom surface with a side surface of an object. Thus, when the taper angle is 90°, the conductive layer has a perpendicular side surface to the bottom surface. With each taper angle set to a degree of less than 90°, a film to be stacked thereover adequately covers the conductive layer; thus, defects can be reduced. Note that in this embodiment mode, $Cl_2$, $SF_6$, and $O_2$ are used as an etching gas for forming the second gate electrode layers and the second conductive layer.

Through the aforementioned steps, gate electrode layers 1124a and 1124b can be formed in a peripheral driver circuit region 1180, and gate electrode layers 1124c and 1124d and a conductive layer 1124e can be formed in a pixel region 1182 (see FIG. 11D). Note that the masks 1116a, 1116b, 1116c, 1116d, and 1116e are removed after the aforementioned steps.

Next, an impurity element imparting n-type conductivity is added using the gate electrode layers 1124a, 1124b, 1124c, and 1124d as masks, thereby forming first n-type impurity regions 1126a, 1126b, 1128a, 1128b, 1130a, 1130b, and 1130c (see FIG. 12A). In this embodiment mode, doping is performed by using phosphine ($PH_3$) as a doping gas containing an impurity element. Here, doping is performed so that phosphorus (P) that is an impurity element imparting n-type conductivity is contained in the first n-type impurity regions at a concentration of approximately greater than or equal to $1 \times 10^{16}/cm^3$ and less than or equal to $5 \times 10^{19}/cm^3$.

Next, masks 1132a, 1132b, and 1132c which cover the single crystal semiconductor layer 1110 and part of the single crystal semiconductor layer 1114 are formed. An impurity element imparting n-type conductivity is added using the masks 1132a, 1132b, and 1132c, and the second gate electrode layer 1122b as masks. Accordingly, second n-type impurity regions 1134a and 1134b; third n-type impurity regions 1136a and 1136b; second n-type impurity regions 1140a, 1140b, and 1140c; and third n-type impurity regions 1142a, 1142b, 1142c, and 1142d are formed. In this embodiment mode, doping is performed by using phosphine ($PH_3$) as a doping gas containing an impurity element. Here, doping is performed so that phosphorus (P) that is an impurity element imparting n-type conductivity is contained in the second n-type impurity regions at a concentration of approximately greater than or equal to $1 \times 10^{17}/cm^3$ and less than or equal to $1 \times 10^{21}/cm^3$. An impurity element which imparts n-type conductivity is added to the third n-type impurity regions 1136a and 1136b so as to contain the impurity element imparting n-type conductivity at a concentration which is t substantially the same as or at a slightly higher concentration than that of the third n-type impurity regions 1142a, 1142b, 1142c, and 1142d. In addition, channel formation regions 1138, 1144a, and 1144b are formed (see FIG. 12B).

Each of the second n-type impurity regions is a high-concentration impurity region and functions as a source or a drain. On the other hand, each of the third n-type impurity regions is a low-concentration impurity region and functions as a so-called LDD (lightly doped drain) region. Each of the third n-type impurity regions 1136a and 1136b is formed in a region overlapping with the first gate electrode layer 1118b. Accordingly, an electric field in the vicinity of a source or a drain can be relieved, and deterioration of on-state current due to hot carriers can be prevented. On the other hand, each of the third n-type impurity regions 1142a, 1142b, 1142c, and 1142d does not overlap with the gate electrode layer 1124c or 1124d; thus, an effect of reducing off-state current can be obtained.

Next, the masks 1132a, 1132b, and 1132c are removed, and masks 1146a and 1146b which cover the single crystal semiconductor layers 1112 and 1114 respectively are formed. An impurity element imparting p-type conductivity is added using the masks 1146a and 1146b and the gate electrode layer 1124a as masks. Accordingly, first p-type impurity regions 1148a and 1148b, and second p-type impurity regions 1150a and 1150b are formed. In this embodiment mode, doping is performed using diborane ($B_2H_6$) as a doping gas containing an impurity element. Here, boron (B) which is an impurity element imparting p-type conductivity is added to the first p-type impurity regions and the second p-type impurity regions at a concentration of approximately greater than or equal to $1 \times 10^{18}/cm^3$ and less than or equal to $5 \times 10^{21}/cm^3$. Further, a channel formation region 1152 is formed (see FIG. 12C).

Each of the first p-type impurity regions is a high-concentration impurity region and functions as a source or a drain. On the other hand, each of the second p-type impurity regions is a low-concentration impurity region and functions as a so-called an LDD (lightly doped drain) region.

Subsequently, the masks 1146a and 1146b are removed. After the masks are removed, an insulating film may be formed so as to cover the side surfaces of the gate electrode layers. The insulating film can be formed by a plasma CVD method or a low-pressure CVD (LPCVD) method. Heat treatment, intense light irradiation, laser light irradiation, or the like may be performed to activate the impurity elements.

Subsequently, an interlayer insulating layer which covers the gate electrode layers and the gate insulating layer is formed. In this embodiment mode, a stacked-layer structure of insulating films 1154 and 1156 is employed (see FIG. 13A). A silicon nitride oxide film is formed as the insulating film 1154 with a thickness of 100 nm and a silicon oxynitride film is formed as the insulating film 1156 with a thickness of 900 nm. Although the two-layer structure is employed in this embodiment mode, a single-layer structure or a stacked-layer structure including three or more layers may be employed. In this embodiment mode, the insulating films 1154 and 1156 are successively formed by a plasma CVD method without being exposed to the air. Note that materials for the insulating films 1154 and 1156 are not limited to the above-described material.

The insulating films 1154 and 1156 can also be formed using a material selected from substances including silicon oxide, silicon nitride, aluminum oxide, aluminum nitride, aluminum oxynitride, aluminum nitride oxide containing more nitrogen than oxygen, aluminum oxide, diamond-like carbon (DLC), a carbon film containing nitrogen, and other substances containing an inorganic insulating material. Further, a siloxane resin may be used as well. Note that a siloxane resin is a resin containing a Si—O—Si bond. Siloxane is composed of a skeleton formed by the bond of silicon (Si) and oxygen (O), in which an organic group containing at least hydrogen (such as an alkyl group and aromatic hydrocarbon) is used as a substituent. A fluoro group may also be used as a substituent. Alternatively, an organic group containing at least hydrogen and a fluoro group may be used. Further, an organic insulating material such as polyimide, acrylic, polyamide, polyimide amide, benzocyclobutene, or polysilazane can be used.

Next, contact holes (openings) that reach the single crystal semiconductor layers and the gate electrode layers are formed in the insulating films 1154 and 1156 and the gate insulating layer 1108, using a mask made of a resist material. Etching may be performed once or a plurality of times depending on the selectivity of materials to be used. In this embodiment mode, first etching is performed under a condition that selectivity of the insulating film 1156 that is a silicon oxynitride film to each of the insulating film 1154 that is a silicon nitride oxide film and the gate insulating layer 1108 can be obtained; thus, the insulating film 1156 is removed. Next, the insulating film 1154 and the gate insulating layer 1108 are removed by second etching, and openings each of which reaches a source or a drain are formed.

Then, a conductive film is formed so as to cover the openings, and the conductive film is etched. Accordingly, source or drain electrode layers 1158a, 1158b, 1160a, 1160b, 1162a, and 1162b which are each electrically connected to part of a source or drain region are formed. For each source or drain electrode layer, one or a plurality of elements selected from aluminum, tantalum, titanium, molybdenum, tungsten, neodymium, chromium, nickel, platinum, gold, silver, copper, magnesium, scandium, cobalt, nickel, zinc, niobium, silicon, phosphorus, boron, arsenic, gallium, indium, and tin; a compound or an alloy material that contains any of the given elements as its main component (e.g., indium tin oxide (ITO), indium zinc oxide (IZO), indium tin oxide to which silicon oxide has been added (ITSO), zinc oxide, aluminum-neodymium (Al—Nd), magnesium-silver (Mg—Ag), or the like); a material that is a combination of any of these compounds; or the like can be used. Alternatively, a silicide (e.g., aluminum-silicide, molybdenum-silicide, or nickel silicide), a nitrogen-containing compound (e.g., titanium nitride, tantalum nitride, or molybdenum nitride), silicon (Si) that is doped with an impurity element such as phosphorus (P), or the like can be used.

Figure 13A:
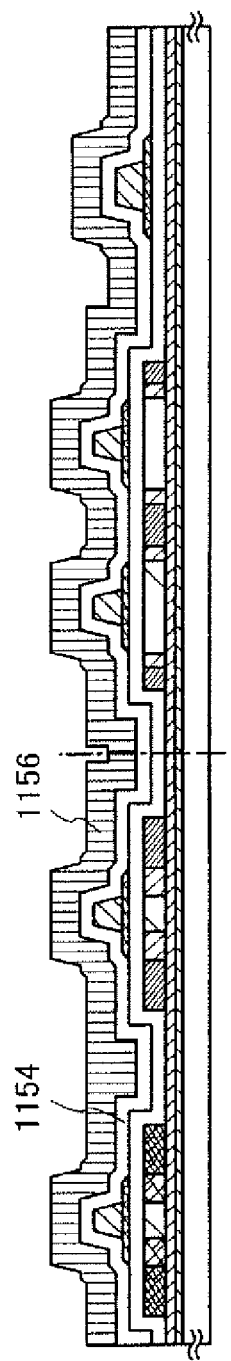
FIGS. 13A to 13C illustrate manufacturing steps of the semiconductor device.
Figure 13B:
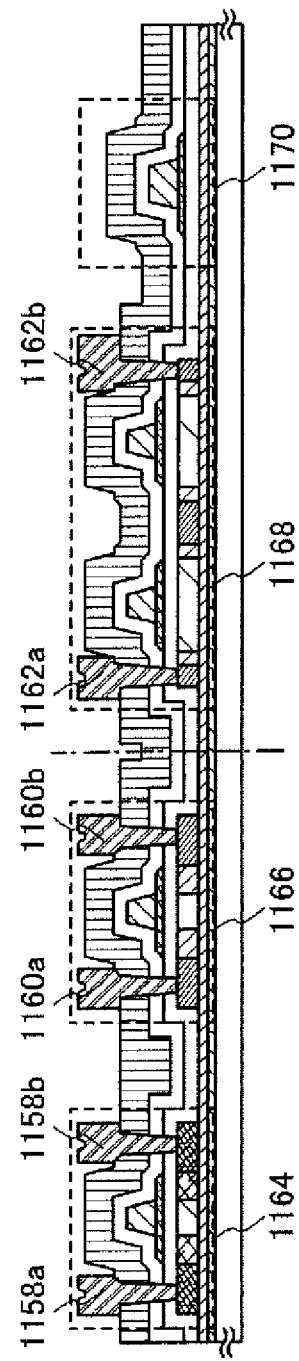

Through the above steps, a p-channel thin film transistor 1164 and an n-channel thin film transistor 1166 are formed in the peripheral driver circuit region 1180, and an n-channel thin film transistor 1168 and a capacitor wiring 1170 are formed in the pixel region 1182 (see FIG. 13B).

Next, an insulating film 1172 is formed as a second interlayer insulating layer. The insulating film 1172 can be formed from a material selected from silicon oxide, silicon nitride, silicon oxynitride, silicon nitride oxide, aluminum oxide, aluminum nitride, aluminum oxynitride, aluminum nitride oxide containing more nitrogen than oxygen, aluminum oxide, diamond-like carbon (DLC), a carbon film containing nitrogen, phosphosilicate glass (PSG), borophosphosilicate glass (BPSG), polysilazane, or other substances containing an inorganic insulating material. Further, a siloxane resin may be used as well. Alternatively, an organic insulating material such as polyimide, acrylic, polyamide, polyimide amide, or benzocyclobutene can be used.

Figure 13C:
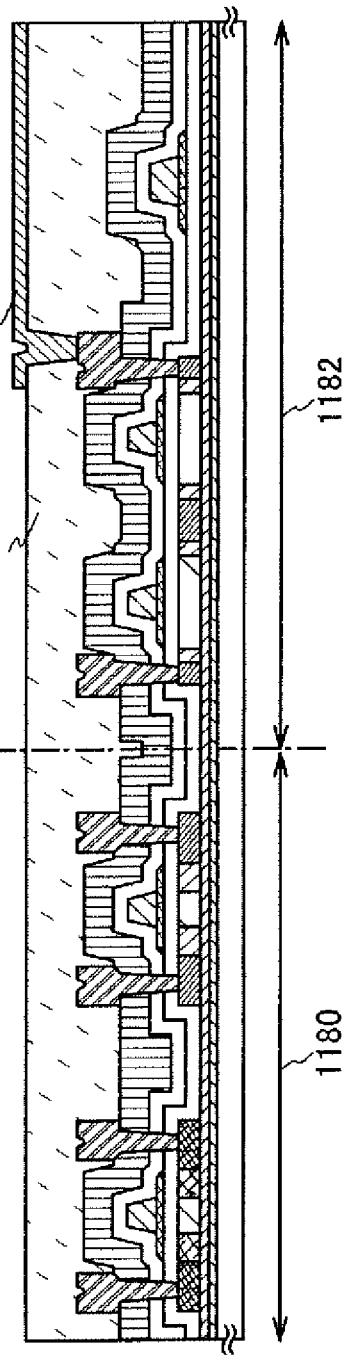

Next, a contact hole is formed in the insulating film 1172 of the pixel region 1182 to form a pixel electrode layer 1174 (see FIG. 13C). The pixel electrode layer 1174 can be formed using indium tin oxide (ITO), indium zinc oxide (IZO) in which indium oxide is mixed with zinc oxide, a conductive material in which indium oxide is mixed with silicon oxide, organic indium, organic tin, indium oxide containing tungsten oxide, indium zinc oxide containing tungsten oxide, indium oxide containing titanium oxide, indium tin oxide containing titanium oxide, or metal such as tungsten, molybdenum, zirconium, hafnium, vanadium, niobium, tantalum, chromium, cobalt, nickel, titanium, platinum, aluminum, copper, or silver, or an alloy or a metal nitride thereof.

A conductive composition including a conductive high molecule (also referred to as a conductive polymer) can be used for the pixel electrode layer 1174. A thin film of a conductive composition preferably has a sheet resistance of less than or equal to 10000 Ω/sq. When a thin film of a conductive composition is formed as a pixel electrode layer having a light-transmitting property, light transmittance is preferably greater than or equal to 70% at a wavelength of 550 nm. In addition, the resistance of the conductive high molecule which is contained in the conductive composition is desirably less than or equal to 0.1 Ω·cm.

As the conductive high molecule, a so-called π electron conjugated conductive high molecule can be used. For example, polyaniline and a derivative thereof, polypyrrole and a derivative thereof, polythiophene and a derivative thereof, a copolymer of those materials, and the like can be given.

Specific examples of the conjugated conductive high molecule are given below: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), polyN-methylpyrrole, polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), poly(3-anilinesulfonic acid), and the like.

The above conductive high molecule may be used alone, or an organic resin may be added thereto in order to adjust the characteristics of the films.

Furthermore, by doping a conductive composition with an acceptor type dopant or a donor type dopant, an oxidation-reduction potential of a conjugated electron of a conjugated conductive high molecule may be changed, whereby electrical conductivity may be adjusted.

The conductive composition as described above is dissolved in water or an organic solvent (e.g., an alcohol-based solvent, a ketone-based solvent, an ester-based solvent, a hydrocarbon-based solvent, or an aromatic-based solvent), so that a thin film which serves as the pixel electrode layer 1174 can be formed by an application method, a coating method, a droplet discharge method (also referred to as an ink-jet method), a printing method, or the like.

Figure 14A:
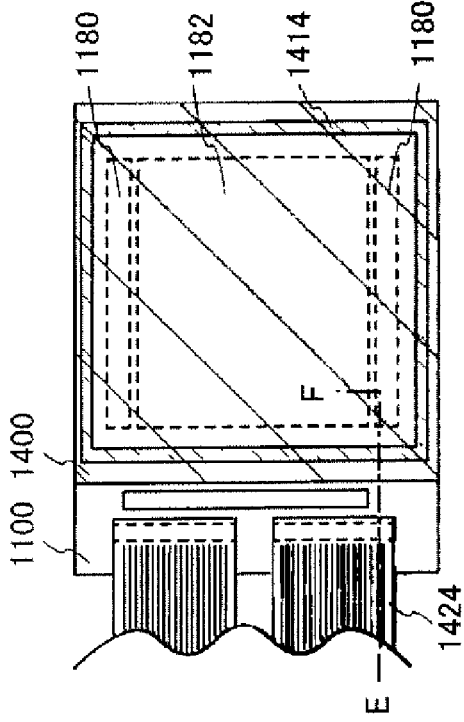
FIGS. 14A and 14B are a plan view and a cross-sectional view of the semiconductor device.
Figure 14B:
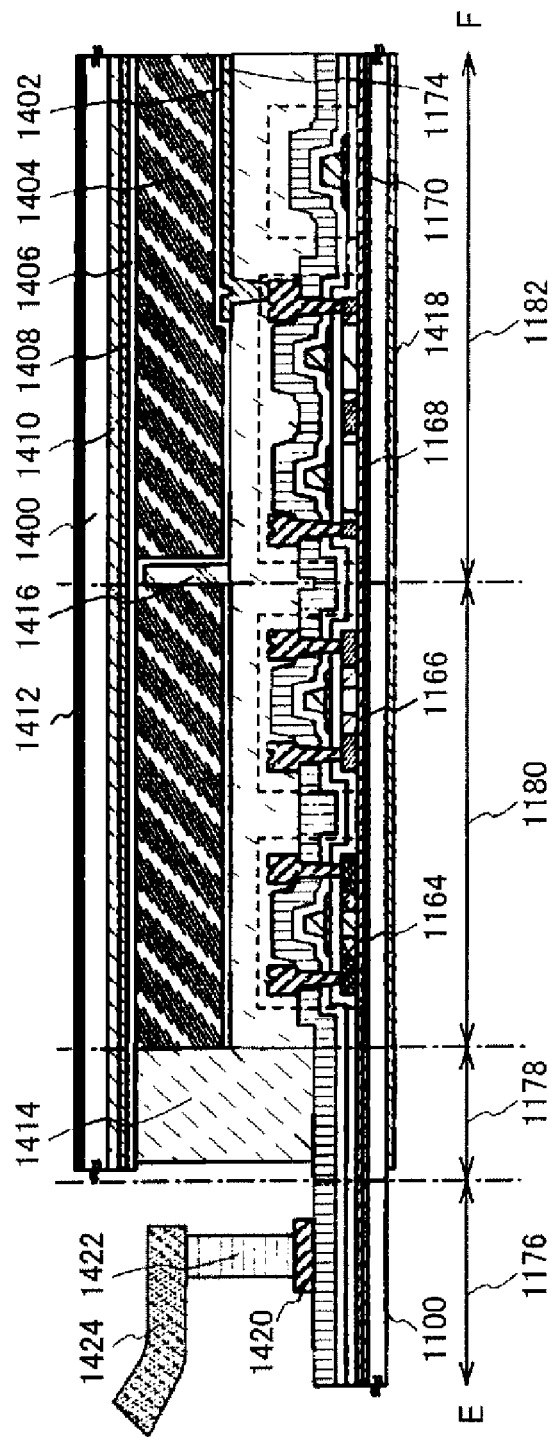

Subsequently, an insulating layer 1402 referred to as an alignment film is formed to cover the pixel electrode layer 1174 and the insulating film 1172 (see FIG. 14B). The insulating layer 1402 can be formed by a screen printing method or an offset printing method. Note that FIGS. 14A and 14B illustrate a plan view and a cross-sectional view of a semiconductor device, respectively. FIG. 14A is a plan view of a semiconductor device, and FIG. 14B is a cross-sectional view taken along a line E-F of FIG. 14A. The semiconductor device includes an external terminal connection region 1176, a sealing region 1178, the peripheral driver circuit region 1180, and the pixel region 1182.

After forming the insulating layer 1402, rubbing treatment is performed. An insulating layer 1406 which serves as an alignment film can be formed in a manner similar to the insulating layer 1402.

Then, a counter substrate 1400 is attached to the base substrate 1100 with a sealing material 1414 and a spacer 1416 interposed therebetween, and a liquid crystal layer 1404 is provided in a gap therebetween. Note that the counter substrate 1400 is provided with the insulating layer 1406 which serves as an alignment film, a conductive layer 1408 which serves as a counter electrode, a coloring layer 1410 which serves as a color filter, a polarizer 1418 (also referred to as a polarizing plate), or the like. Note that although a case where the base substrate 1100 is provided with a polarizer 1418 (a polarizing plate) is illustrated, the present invention is not limited thereto. For example, a polarizer may be provided on one side in a reflective type liquid crystal display device.

Subsequently, an FPC 1424 is connected to a terminal electrode layer 1420 that is electrically connected to the pixel region, with an anisotropic conductive layer 1422 interposed therebetween. The FPC 1424 has a function of transmitting a signal from the external. The liquid crystal display device can be manufactured by the above-described steps.

In this embodiment mode, a liquid crystal display device is manufactured using the semiconductor substrate illustrated in Embodiment Mode 1. Therefore, with the use of a single crystal semiconductor layer in which bonding is favorably performed, a semiconductor element serving as switching of a liquid crystal, a semiconductor element in a driver circuit region, and the like can be manufactured. Accordingly, characteristics of a semiconductor element is improved, and display characteristics of a liquid crystal display device is largely improved. In addition, because reliability of a semiconductor element is improved, reliability of the liquid crystal display device is also improved.

Note that a method for manufacturing a liquid crystal display device is described in this embodiment mode; however, the present invention is not limited thereto. This embodiment mode can be combined with Embodiment Mode 1 to Embodiment Mode 4 as appropriate.

Embodiment Mode 6

This embodiment mode describes a semiconductor device having a light-emitting element related to the present invention (an electroluminescence display device). Note that as to a method for manufacturing transistors which are used for a peripheral driver circuit, a pixel region, and the like, it is possible to refer to Embodiment Mode 5; thus, the details are omitted.

As to a semiconductor device having a light-emitting element, any one of bottom emission, top emission, and dual emission can be employed. This embodiment mode describes a semiconductor device employing bottom emission with reference to FIGS. 15A and 15B; however, the present invention is not limited thereto.

In a semiconductor device illustrated in FIGS. 15A and 15B, light is emitted downwardly (in a direction indicated by an arrow). Here, FIG. 15A is a plan view of the semiconductor device, and FIG. 15B is a cross-sectional view taken along a line G-H of FIG. 15A. In FIGS. 15A and 15B, the semiconductor device includes an external terminal connection region 1530, a sealing region 1532, a driver circuit region 1534, and a pixel region 1536.

The semiconductor device illustrated in FIGS. 15A and 15B includes an element substrate 1500, thin film transistors 1550, 1552, 1554, and 1556, a light-emitting element 1560, an insulating layer 1568, a filler 1570, a sealant 1572, a wiring layer 1574, a terminal electrode layer 1576, an anisotropic conductive layer 1578, an FPC 1580, and a sealing substrate 1590. Note that the light-emitting element 1560 includes a first electrode layer 1562, a light-emitting layer 1564, and a second electrode layer 1566.

As the first electrode layer 1562, a light-transmitting conductive material is used so that light emitted from the light-emitting layer 1564 can be transmitted. On the other hand, as the second electrode layer 1566, a conductive material which can reflect light emitted from the light-emitting layer 1564 is used.

As the first electrode layer 1562, indium oxide containing tungsten oxide, indium zinc oxide containing tungsten oxide, indium oxide containing titanium oxide, indium tin oxide containing titanium oxide, or the like can be used. Of course, indium tin oxide (ITO), indium zinc oxide (IZO), indium tin oxide to which silicon oxide is added (ITSO), or the like may also be used.

A conductive composition containing a conductive high molecule (also referred to as a conductive polymer) can also be used as the first electrode layer 1562. Note that as to the details, it is possible to refer to Embodiment Mode 5; thus, the descriptions are omitted.

As the second electrode layer 1566, a conductive film formed of titanium, tungsten, nickel, gold, platinum, silver, copper, tantalum, molybdenum, aluminum, magnesium, calcium, lithium, or an alloy thereof may be used. A substance having high reflectivity in a visible region is preferable, and an aluminum film is used in this embodiment mode.

Note that in the case of employing each of top emission and dual emission, the design of the electrode layers maybe changed, as appropriate. Specifically, in the case of top emission, the first electrode layer 1562 is formed using a reflective material, and the second electrode layer 1566 is formed using a light-transmitting material. In the case of dual emission, the first electrode layer 1562 and the second electrode layer 1566 may be formed using a light-transmitting material. Note that in the case of bottom emission and top emission, a structure may be employed in which one electrode layer is formed using a light-transmitting material and the other electrode layer is formed in a stacked-layer structure of a light-transmitting material and a light-reflecting material. The material that can be used for the electrode layers is similar to the material in the case of bottom emission; thus, the descriptions are omitted.

Note that even a material like metal which is generally considered to have no light-transmitting property can transmit light when it has a small thickness (approximately greater than or equal to 5 nm and less than or equal to 30 nm). Accordingly, an electrode layer which transmits light can also be formed using the above-described light-reflecting material.

The sealing substrate 1590 may be provided with a color filter (a coloring layer). The color filter (a coloring layer) can be formed by an evaporation method or a droplet discharge method. Alternatively, a color conversion layer may be used.

In this embodiment mode, an electroluminescent display device is manufactured using a semiconductor substrate illustrated in Embodiment Mode 1. Therefore, with the use of a single crystal semiconductor layer in which bonding is favorably performed, a semiconductor element serving as light emission of an electroluminescent display device, a semiconductor element in a driver circuit region, and the like can be manufactured. Accordingly, characteristics of a semiconductor element are improved, and display characteristics of an electroluminescent display device are largely improved. In addition, because reliability of a semiconductor element is improved, reliability of the electroluminescent display device is also improved.

Note that a method for manufacturing an electroluminescent display device is described in this embodiment mode; however, the present invention is not limited thereto. This embodiment mode can be combined with Embodiment Mode 1 to Embodiment Mode 5 as appropriate.

Embodiment Mode 7

Figure 16:
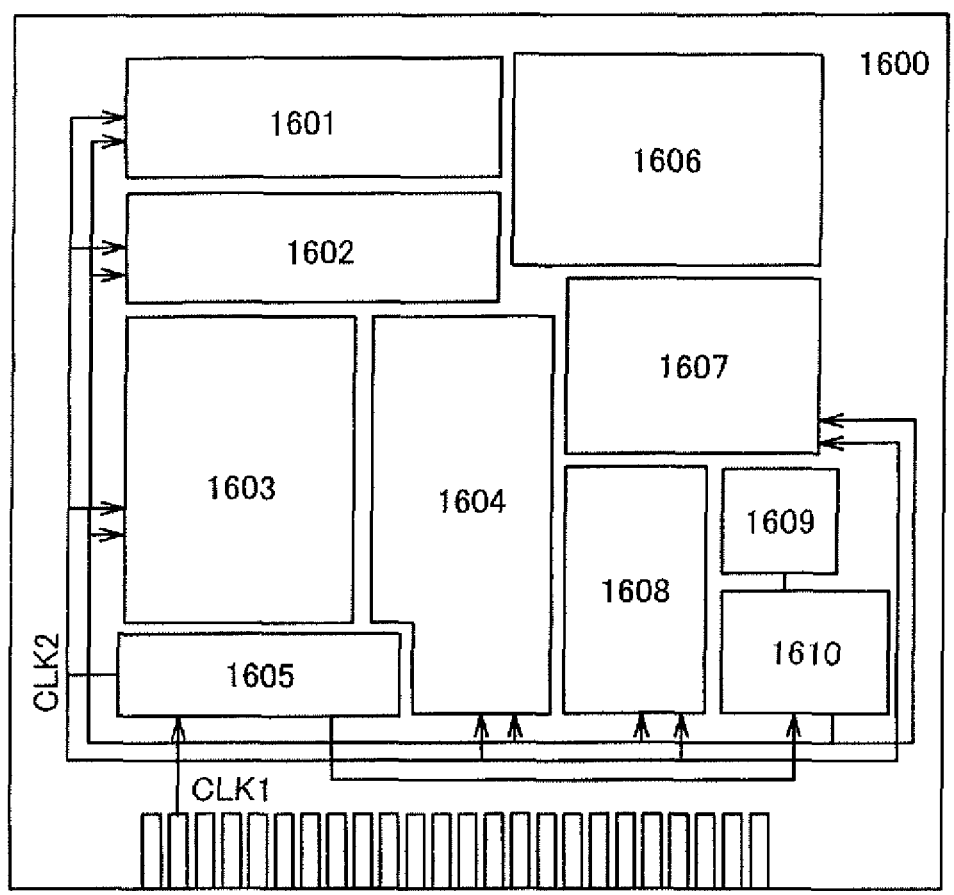
FIG. 16 illustrates a structure of a semiconductor device.
Figure 17:
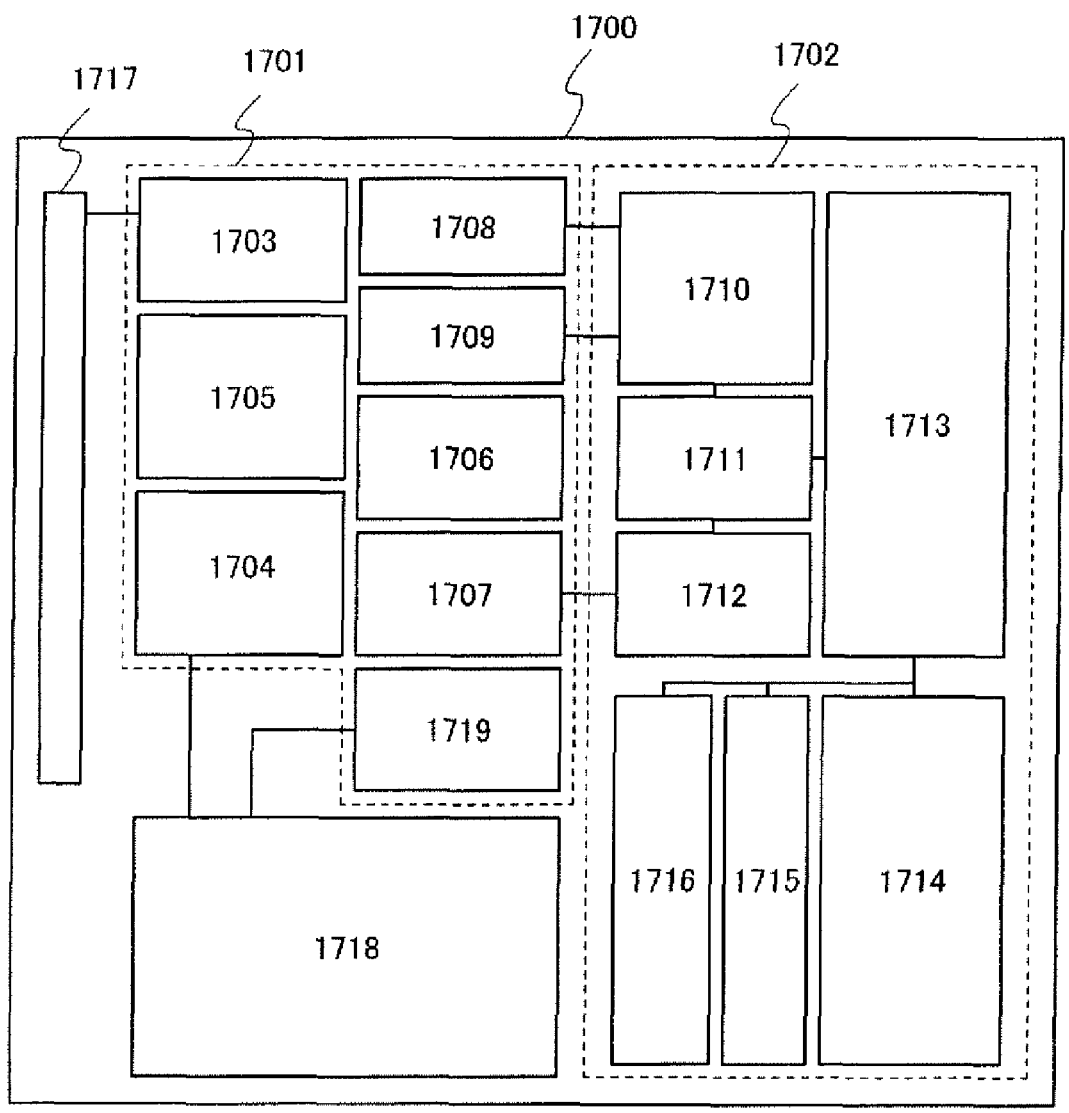
FIG. 17 illustrates a structure of a semiconductor device.

This embodiment mode describes another example of a semiconductor device of the present invention with reference to FIGS. 16 and 17. Note that a microprocessor and an electronic tag are given as examples in this embodiment mode; however, the semiconductor device of the present invention is not limited thereto.

FIG. 16 illustrates an example of a microprocessor of the present invention. A microprocessor 1600 in FIG. 16 is manufactured using the semiconductor substrate of the present invention. This microprocessor 1600 has an arithmetic logic unit (ALU) 1601, an ALU controller 1602, an instruction decoder 1603, an interrupt controller 1604, a timing controller 1605, a register 1606, a register controller 1607, a bus interface (Bus I/F) 1608, a read-only memory (ROM) 1609, and a ROM interface (ROM I/F) 1610.

An instruction input to the microprocessor 1600 through the bus interface 1608 is input to the instruction decoder 1603, decoded therein, and then input to the ALU controller 1602, the interrupt controller 1604, the register controller 1607, and the timing controller 1605. The ALU controller 1602, the interrupt controller 1604, the register controller 1607, and the timing controller 1605 conduct various controls based on the decoded instruction. In specific, the ALU controller 1602 generates signals for controlling the operation of the ALU 1601. While the microprocessor 1600 is executing a program, the interrupt controller 1604 processes an interrupt request from an external input/output device or a peripheral circuit based on its priority or the like. The register controller 1607 generates an address of the register 1606, and reads and writes data from and to the register 1606 in accordance with the state of the microprocessor 1600. The timing controller 1605 generates signals for controlling timing of operation of the ALU 1601, the ALU controller 1602, the instruction decoder 1603, the interrupt controller 1604, and the register controller 1607. For example, the timing controller 1605 is provided with an internal clock generator for generating an internal clock signal CLK2 based on a reference clock signal CLK1, and supplies the internal clock signal CLK2 to the above-mentioned various circuits. Note that the structure of the microprocessor 1600 illustrated in FIG. 16 is merely an example, and can be changed as appropriate depending on the uses.

In this embodiment mode, a microprocessor is manufactured using the semiconductor substrate illustrated in Embodiment Mode 1. Therefore, characteristics of a semiconductor element are improved, which contributes to improvement of performance of a microprocessor. In addition, because reliability of the semiconductor element is improved, reliability of the microprocessor is also improved.

Next, an example of a semiconductor device having an arithmetic function and capable of contactless data transmission and reception is described with reference to FIG. 17. FIG. 17 illustrates an example of a wireless tag which transmits and receives signals to/from an external device by wireless communication. Note that the wireless tag of the present invention includes a central processing unit (CPU), so to speak, a miniaturized computer. A wireless tag 1700 has an analog circuit portion 1701 and a digital circuit portion 1702. The analog circuit portion 1701 has a resonance circuit 1703 with a resonance capacitor, a rectifier circuit 1704, a constant voltage circuit 1705, a reset circuit 1706, an oscillator circuit 1707, a demodulator circuit 1708, a modulator circuit 1709, and a power management circuit 1719. The digital circuit portion 1702 has an RF interface 1710, a control register 1711, a clock controller 1712, a CPU interface 1713, a CPU 1714, a RAM 1715, and a ROM 1716.

The operation of the wireless tag 1700 having such a structure is described below. When an antenna 1717 receives a signal from outside, an induced electromotive force is generated in the resonance circuit 1703 based on the signal. A capacitor portion 1718 is charged with the induced electromotive force which has passed through the rectifier circuit 1704. This capacitor portion 1718 is preferably formed using a capacitor such as a ceramic capacitor or an electric double layer capacitor. The capacitor portion 1718 may be formed over the same substrate as the wireless tag 1700 or may be attached as another component to a substrate that partially constitutes the wireless tag 1700.

The reset circuit 1706 generates a signal for resetting and initializing the digital circuit portion 1702. For example, a signal that rises after an increase in power supply voltage is generated as the reset signal. The oscillator circuit 1707 changes the frequency and duty ratio of a clock signal in response to a control signal generated by the constant voltage circuit 1705. The demodulator circuit 1708 having a low pass filter binarizes changes in amplitude of an amplitude-modulated (ASK) reception signals, for example. The modulator circuit 1709 varies the amplitude of an amplitude-modulated (ASK) transmission signal and transmits the signal. The modulator circuit 1709 varies the resonance point of the resonance circuit 1703, thereby varying the amplitude of communication signals. The clock controller 1712 generates a control signal for changing the frequency and duty ratio of a clock signal in accordance with the power supply voltage or a consumption current of the CPU 1714. The power supply voltage is monitored by the power management circuit 1719.

A signal that is input to the wireless tag 1700 from the antenna 1717 is demodulated by the demodulator circuit 1708, and then divided into a control command, data, and the like by the RF interface 1710. The control command is stored in the control register 1711. The control command includes a reading instruction of data stored in the ROM 1716, a writing instruction of data to the RAM 1715, an arithmetic instruction to CPU 1714, and the like. The CPU 1714 accesses the ROM 1716, the RAM 1715, and the control register 1711 via the CPU interface 1713. The CPU interface 1713 has a function of generating an access signal for any one of the ROM 1716, the RAM 1715, and the control register 1711 based on an address requested by the CPU 1714.

As an arithmetic method of the CPU 1714, a method may be employed in which the ROM 1716 stores an operating system (OS) and a program is read and executed at the time of starting operation. Alternatively, a method may be employed in which an arithmetic circuit is formed and an arithmetic process is conducted using hardware. In a method in which both hardware and software are used, a method can be employed in which the circuit dedicated to arithmetic conducts part of process and the CPU 1714 conducts the other part of the arithmetic process by using a program.

In this embodiment mode, a wireless tag is manufactured using a semiconductor substrate illustrated in Embodiment Mode 1. Therefore, characteristics of a semiconductor element are improved, which contributes to improvement of performance of a wireless tag. In addition, because reliability of a semiconductor element is improved, reliability of the wireless tag is also improved.

Note that this embodiment mode can be combined with Embodiment Mode 1 to Embodiment Mode 6 as appropriate.

Embodiment Mode 8

This embodiment mode describes electronic devices each using a semiconductor device of the present invention, particularly using a display device, with reference to FIGS. 18A to 18H, and FIGS. 19A to 19C.

As electronic devices manufactured using the semiconductor device (particularly using the display device) of the present invention, the following can be given: a video camera, a digital camera, a goggle type display (a head mounted display), a navigation system, an audio reproducing device (car audio set, or the like), a computer, a game machine, a portable information terminal (mobile computer, a cellular phone, a portable game machine, an e-book reader, or the like), and an image reproducing device provided with a recording medium (specifically, a device provided with a display that can reproduce a recording medium such as a digital versatile disc (DVD) and display the image), and the like.

Figure 18A:
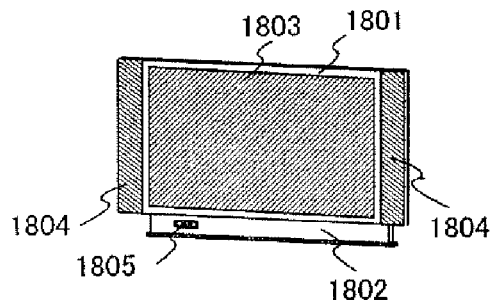
FIGS. 18A to 18H illustrate examples of electronic devices each using a semiconductor device.

FIG. 18A illustrates a television set or a monitor of a personal computer. The television set or the monitor of a personal computer includes a housing 1801, a support stand 1802, a display portion 1803, speaker portions 1804, video input terminals 1805, and the like. The semiconductor device of the present invention is used for the display portion 1803. According to the present invention, a high-performance and highly-reliable television set or monitor of a personal computer can be provided.

Figure 18B:
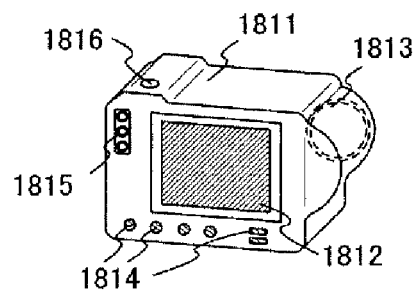

FIG. 18B illustrates a digital camera. On the front side part of a main body 1811, an image receiver 1813 is provided, and on the top side part of the main body 1811, a shutter button 1816 is provided. Furthermore, on the back side part of the main body 1811, a display portion 1812, operation keys 1814, and an external connection port 1815 are provided. The semiconductor device of the present invention is used for the display portion 1812. According to the present invention, a high-performance and highly-reliable digital camera can be provided.

Figure 18C:
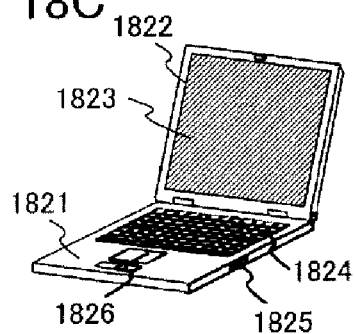

FIG. 18C illustrates a notebook personal computer. In a main body 1821, a keyboard 1824, an external connection port 1825, and a pointing device 1826 are provided. Furthermore, a housing 1822 that has a display portion 1823 is attached to the main body 1821. The semiconductor device of the present invention is used for the display portion 1823. According to the present invention, a high-performance and highly-reliable notebook personal computer can be provided.

Figure 18D:
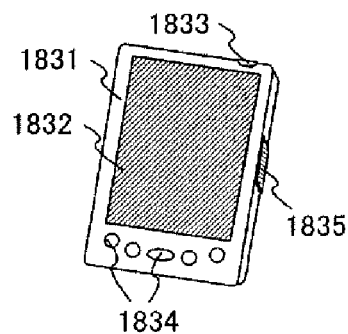

FIG. 18D illustrates a mobile computer that includes a main body 1831, a display portion 1832, a switch 1833, operation keys 1834, an infrared port 1835, and the like. Furthermore, an active matrix display device is provided in the display portion 1832. The semiconductor device of the present invention is used for the display portion 1832. According to the present invention, a high-performance and highly-reliable mobile computer can be provided.

Figure 18E:
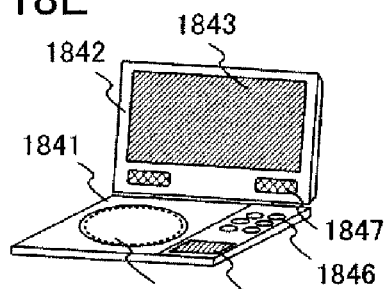

FIG. 18E illustrates an image reproducing device. In a main body 1841, a display portion 1844, a storage media reader 1845, and operation keys 1846 are provided. Furthermore, a housing 1842 that has speaker portions 1847 and a display portion 1843 is attached to the main body 1841. The semiconductor device of the present invention is used for each of the display portion 1843 and the display portion 1844. According to the present invention, a high-performance and highly reliable image reproducing device can be provided.

Figure 18F:
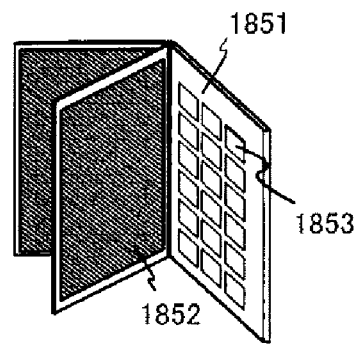

FIG. 18F illustrates an electronic book reader. In a main body 1851, operation keys 1853 are provided. Furthermore, a plurality of display portions 1852 is attached to the main body 1851. The semiconductor device of the present invention is used for the display portion 1852. According to the present invention, a high-performance and highly-reliable electronic book can be provided.

Figure 18G:
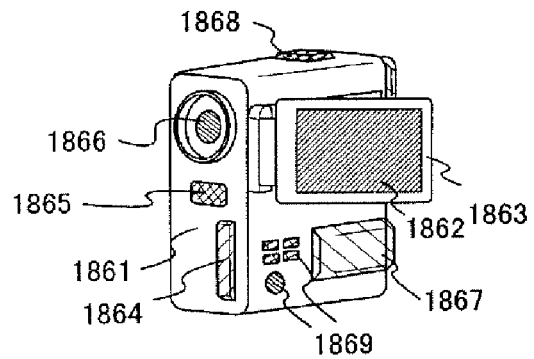

FIG. 18G illustrates a video camera. In a main body 1861, an external connection port 1864, a remote control receiver 1865, an image receiver 1866, a battery 1867, an audio input portion 1868, operation keys 1869 are provided. Furthermore, a housing 1863 that has a display portion 1862 is attached to the main body 1861. The semiconductor device of the present invention is used for the display portion 1862. According to the present invention, a high-performance and highly-reliable video camera can be provided.

Figure 18H:
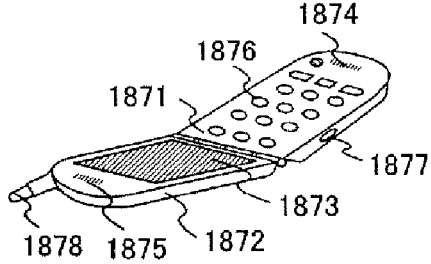

FIG. 18H illustrates a cellular phone that includes a main body 1871, a housing 1872, a display portion 1873, an audio input portion 1874, an audio output portion 1875, operation keys 1876, an external connection port 1877, an antenna 1878, and the like. The semiconductor device of the present invention is used for the display portion 1873. According to the present invention, a high-performance and highly-reliable cellular phone can be provided.

Figure 19A:
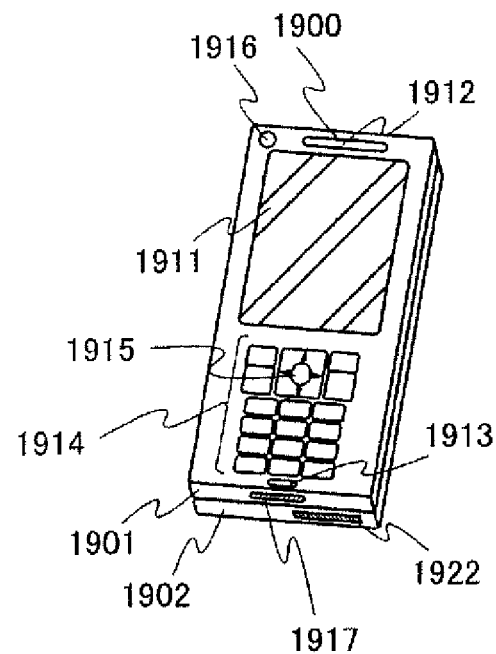
FIGS. 19A to 19C illustrate an example of an electronic device using a semiconductor device.
Figure 19B:
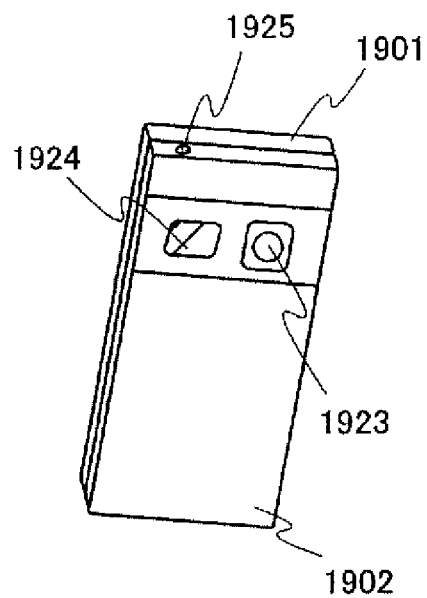
Figure 19C:
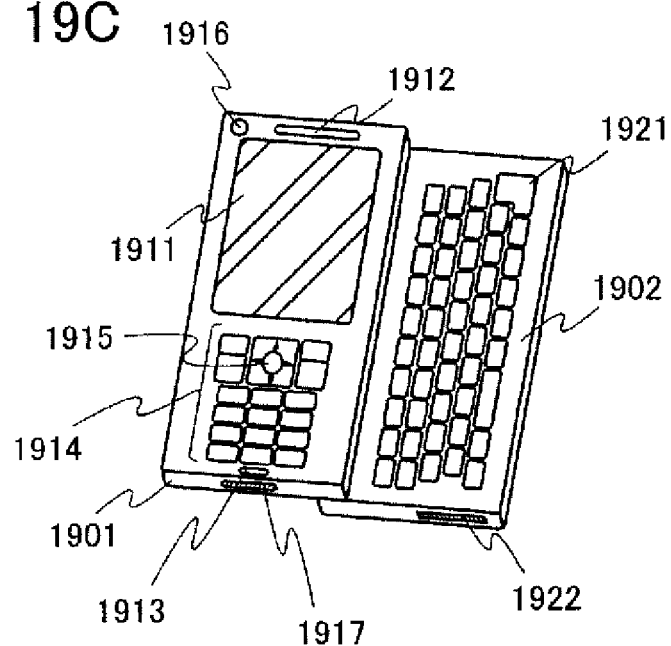
Figure 20A:
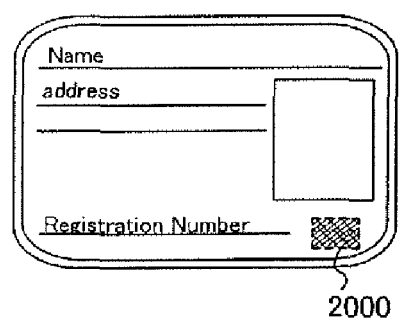
FIGS. 20A to 20F illustrate applications of semiconductor devices.
Figure 20B:
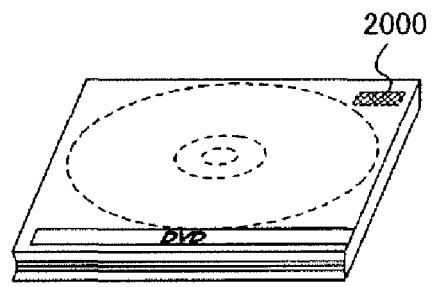
Figure 20C:
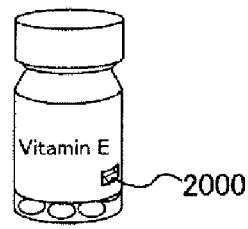
Figure 20D:
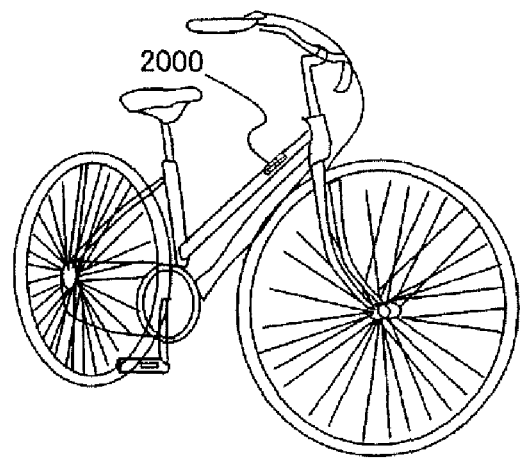
Figure 20E:
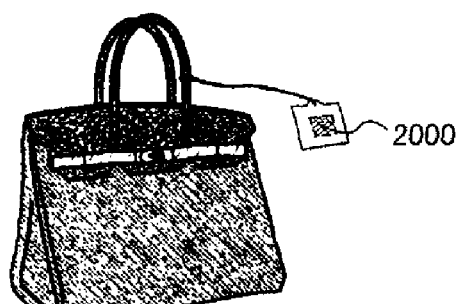
Figure 20F:
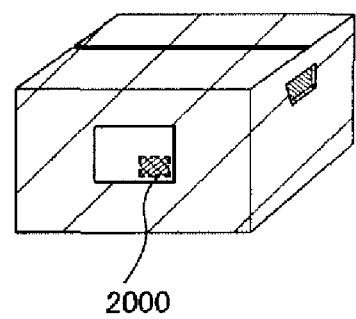

FIGS. 19A to 19C illustrate a structural example of a portable electronic device 1900 having functions as a telephone and an information terminal. FIG. 19A is a front view, FIG. 19B is a back view, and FIG. 19C is a developed view. The portable electronic device 1900 has functions as both a telephone and an information terminal and is an electronic device so-called a smartphone which is capable of various data processing in addition to voice call.

The portable electronic device 1900 includes housings 1901 and 1902. The housing 1901 is provided with a display portion 1911, a speaker 1912, a microphone 1913, operation keys 1914, a pointing device 1915, a lens 1916 for camera, an external connection terminal 1917, and the like. The housing 1902 is provided with a keyboard 1921, an external memory slot 1922, a lens 1923 for camera, a light 1924, an earphone terminal 1925, and the like. Moreover, an antenna is built into the housing 1901. In addition to the above-described structure, a wireless IC ship, a small size memory device, or the like can be built therein.

The semiconductor device of the present invention is incorporated in the display portion 1911. An image displayed (and direction in which the image is displayed) in the display portion 1911 variously changes with respect to the usage pattern of the portable electronic device 1900. Moreover, since the display portion 1911 and the lens 1916 for camera are provided on the same surface, voice call (so-called videophone) with images can be possible. Note that the speaker 1912 and the microphone 1913 can be used not only for voice call but also for recording, reproducing, or the like. In the case where a still image and a moving image are shot by using the lens 1923 for camera (and the light 1924), the display portion 1911 is used as a finder. The operation keys 1914 are used for incoming/outgoing of phone call, inputting simple information such as e-mail, screen scrolling, moving cursor, and the like.

The housings 1901 and 1902 overlapped with each other (FIG. 19A) slide and can be developed as illustrated in FIG. 19C, so that the portable electronic device 1900 can be used as an information terminal. In that case, smooth operation with the keyboard 1921 and the pointing device 1915 can be performed. The external connection terminal 1917 can be connected to various cables such as an AC adopter or a USB cable, whereby the portable electronic device 1900 can be charged or can perform data communication with a computer or the like. Moreover, by inserting a recording medium into the external memory slot 1922, the portable electronic device 400 can deal with storing and moving data with higher capacitance. In addition to the above-described functions, a function of wireless communication by using electromagnetic waves such as infrared rays, a function of receiving television, and the like can be included. According to the present invention, a high-performance and highly-reliable portable electronic device can be provided.

As described above, the present invention can be widely applied to and used in electronic devices in various fields. Note that his embodiment mode can be combined with Embodiment Mode 1 to Embodiment Mode 7 as appropriate.

Embodiment Mode 9

This embodiment mode describes applications of a semiconductor device, in particular, a wireless tag of the present invention with reference to FIGS. 20A to 20F.

According to the present invention, a semiconductor device which functions as a wireless tag can be formed. A wireless tag can be used in a wide variety of applications, and may be used by being mounted on objects such as bills, coins, securities, bearer bonds, certificates (driver's licenses, resident cards, and the like, see FIG. 20A), containers for wrapping objects (wrapping paper, bottles, and the like, see FIG. 20C), recording media (DVD software, video tapes, and the like, see FIG. 20B), vehicles (bicycles and the like, see FIG. 20D), personal belongings (bags, glasses, and the like), foods, plants, clothes, lifestyle goods, and products such as electronic devices, or shipping tags of baggage (see FIGS. 20E and 20F). Note that the wireless tag is indicated by reference numeral 2000 in each of FIGS. 20A to 20F.

Note that the electronic device indicates a liquid crystal display device, an EL display device, a television unit (also simply referred to as a TV, a TV receiver, or a television receiver), a cellular phone, and the objects shown in Embodiment Mode 5, for example. The semiconductor device may also be mounted on animals, human body, and the like.

The wireless tag is attached to a surface of an object, or embedded to be fixed on an object. For example, the RFID tag may be embedded in paper of a book, or an organic resin of a container for wrapping an object to be fixed on each object. Counterfeits can be prevented by providing an RFID tag on the bills, coins, securities, bearer bonds, certificates, and the like. Further, by providing an RFID tag in containers for wrapping objects, recording media, personal belongings, foods, clothes, lifestyle goods, electronic devices, and the like, inspection systems, rental systems and the like can be performed more efficiently. The wireless tag that can be formed according to the present invention has high reliability though it is inexpensive, and can be applied to various objects.

When a wireless tag that can be formed according to the present invention is applied to a management system or a distribution system of articles, the system can have high functionality. For example, information which is recorded in an RFID tag provided in a tag is read by a reader/writer provided near a conveyor belt, then information about a distribution process, a delivery destination, or the like is read out, and inspection of merchandise or distribution of goods can be easily carried out.

As described, the present invention can be widely applied to and used in various objects. Note that this embodiment mode can be implemented by being combined with any of Embodiment Modes 1 to 7, as appropriate.

This application is based on Japanese Patent Application serial no. 2007-305461 filed with Japan Patent Office on Nov. 27, 2007, the entire contents of which are hereby incorporated by reference.

What is claimed is:

1. A method for manufacturing a semiconductor substrate in which two substrates are bonded, comprising the steps of:
   placing a first substrate at a region surrounded by an airtight holding mechanism provided over a support;
   placing a second substrate so as to be in contact with the airtight holding mechanism to ensure airtightness of a space surrounded by the support, the airtight holding mechanism, and the second substrate;
   evacuating the space, thereby reducing a pressure in the space;
   disposing the second substrate in close contact with the first substrate using difference between the pressure in the space and an outside atmospheric pressure; and
   performing heat treatment, thereby bonding the first substrate and the second substrate in a reduced-pressure atmosphere.

2. The method for manufacturing the semiconductor substrate according to claim 1, wherein an elastic body is used in a part of the airtight holding mechanism.

3. The method for manufacturing the semiconductor substrate according to claim 2, wherein silicone rubber, fluorine-based rubber, or perfluoro-rubber is used as the elastic body.

4. The method for manufacturing the semiconductor substrate according to claim 1, wherein the airtight holding mechanism has a function of adjusting an interval between the first substrate and the second substrate.

5. A method for manufacturing a semiconductor substrate, comprising the steps of:
   placing a first substrate at a region surrounded by an airtight holding mechanism over a support;
   placing a second substrate so as to be in contact with the airtight holding mechanism;
   evacuating a space surrounded by the support, the airtight holding mechanism, and the second substrate, thereby reducing a pressure in the space; and
   bonding the first substrate and the second using difference between the pressure in the space and an outside atmospheric pressure.

6. The method for manufacturing the semiconductor substrate according to claim 5, wherein an elastic body is used in a part of the airtight holding mechanism.

7. The method for manufacturing the semiconductor substrate according to claim 6, wherein silicone rubber, fluorine-based rubber, or perfluoro-rubber is used as the elastic body.

8. The method for manufacturing the semiconductor substrate according to claim 5, wherein the airtight holding mechanism has a function of adjusting an interval between the first substrate and the second substrate.

* * * * *